(12) United States Patent
Zaderej et al.

(10) Patent No.: US 7,753,744 B2
(45) Date of Patent: *Jul. 13, 2010

(54) GROUPED ELEMENT TRANSMISSION CHANNEL LINK WITH PEDESTAL ASPECTS

(75) Inventors: Victor Zaderej, St. Charles, IL (US); David L. Brunker, Naperville, IL (US); Philip J. Dambach, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/409,955

(22) Filed: Mar. 24, 2009

(65) Prior Publication Data

US 2009/0227153 A1    Sep. 10, 2009

Related U.S. Application Data

(60) Continuation of application No. 11/804,081, filed on May 17, 2007, now Pat. No. 7,699,672, which is a division of application No. 10/515,299, filed as application No. PCT/US2004/007841 on Mar. 15, 2004, now Pat. No. 7,273,401.

(60) Provisional application No. 60/454,883, filed on Mar. 14, 2003.

(51) Int. Cl.
*H01R 9/24* (2006.01)
(52) U.S. Cl. .................. 439/886; 439/931; 439/736
(58) Field of Classification Search ........... 439/886, 439/931, 722, 736, 108
See application file for complete search history.

(56) References Cited

U.S. PATENT DOCUMENTS

| | | | |
|---|---|---|---|
| 2,926,317 A | 2/1960 | Blitz | |
| 3,093,805 A | 6/1963 | Osifchin et al. | |
| 3,659,916 A | 5/1972 | Marcatill | |
| 4,382,236 A | 5/1983 | Suzuki | |
| 4,666,226 A | 5/1987 | Legrand et al. | |
| 4,707,671 A | 11/1987 | Suzuki et al. | |
| 4,812,275 A | 3/1989 | Yumoto | |
| 4,818,239 A | 4/1989 | Erk | |
| 4,878,856 A | 11/1989 | Maxwell | |
| 4,891,616 A | 1/1990 | Renken et al. | |
| 4,908,259 A | 3/1990 | Yumoto | |

(Continued)

FOREIGN PATENT DOCUMENTS

DE    43 26 989    3/1994

(Continued)

OTHER PUBLICATIONS

International Search Report for PCT/US2004/007841, Nov. 22, 2004.

*Primary Examiner*—Tho D Ta
(74) *Attorney, Agent, or Firm*—Stephen L. Sheldon

(57) ABSTRACT

A pedestal connector that incorporates one or more grouped element channel link transmission lines is seen to have a dielectric body and two opposing contact ends that are intended to contact opposing contacts or traces. The dielectric body has an S-shaped configuration such that the transmission lines supported thereon make at least one change in direction, thereby permitting the use of such connector to interconnect elements lying in two different planes. The transmission lines include slots that extend within the frame and which define opposing, conductive surfaces formed on the dielectric body which are separated by an intervening air gap.

10 Claims, 25 Drawing Sheets

U.S. PATENT DOCUMENTS

| | | |
|---|---|---|
| 5,015,519 A | 5/1991 | Yumoto |
| 5,069,626 A | 12/1991 | Patterson et al. |
| 5,071,363 A * | 12/1991 | Reylek et al. ............... 439/291 |
| 5,080,609 A | 1/1992 | Fabian et al. |
| 5,085,590 A | 2/1992 | Galloway |
| 5,098,759 A | 3/1992 | Nakai et al. |
| 5,098,769 A | 3/1992 | Nakai et al. |
| 5,108,295 A | 4/1992 | Koike et al. |
| 5,114,364 A | 5/1992 | Hunter |
| 5,133,669 A | 7/1992 | Barnhouse et al. |
| 5,149,915 A | 9/1992 | Brunker et al. |
| 5,160,275 A | 11/1992 | Nakamura et al. |
| 5,192,228 A | 3/1993 | Collins et al. |
| 5,235,132 A | 8/1993 | Ainsworth et al. |
| 5,267,876 A | 12/1993 | Rupert et al. |
| 5,468,918 A | 11/1995 | Kanno et al. |
| 5,575,688 A | 11/1996 | Crane |
| 5,626,483 A | 5/1997 | Naitoh |
| 5,727,956 A | 3/1998 | Mitra et al. |
| 5,909,012 A | 6/1999 | Todd et al. |
| 5,986,607 A | 11/1999 | Rudisill |
| 5,995,380 A | 11/1999 | Eakins et al. |
| 6,074,248 A | 6/2000 | Huang |
| 6,185,354 B1 | 2/2001 | Kronz et al. |
| 6,200,146 B1 | 3/2001 | Sarkissian |
| 6,296,518 B1 | 10/2001 | Avery et al. |
| 6,302,731 B1 | 10/2001 | Kring |
| 6,464,510 B1 | 10/2002 | Len |
| 6,491,545 B1 | 12/2002 | Spiegel et al. |
| 6,765,804 B2 | 7/2004 | Hudson et al. |
| 6,840,810 B2 | 1/2005 | Brunker et al. |
| 6,899,546 B2 | 5/2005 | Longueville et al. |
| 6,976,881 B2 | 12/2005 | Brunker et al. |
| 7,061,342 B2 | 6/2006 | Brunker et al. |
| 7,101,188 B1 | 9/2006 | Summers et al. |
| 7,273,401 B2 | 9/2007 | Zaderej et al. |
| 2003/0010529 A1 | 1/2003 | Sievenpiper et al. |
| 2005/0026469 A1 | 2/2005 | Ice et al. |
| 2008/0102692 A1 | 5/2008 | Zaderej et al. |

FOREIGN PATENT DOCUMENTS

| | | |
|---|---|---|
| DE | 44 16 986 | 5/1995 |
| DE | 195 03 666 | 9/1995 |
| EP | 0 343 771 | 11/1989 |
| EP | 0 598 336 | 5/1994 |
| EP | 0 693 795 | 1/1996 |
| EP | 0 901 201 | 3/1999 |
| GB | 655803 | 8/1951 |
| JP | 1106602 | 4/1989 |
| JP | 62264081 | 4/1989 |
| JP | 10276203 | 9/1998 |

* cited by examiner

FIG.56
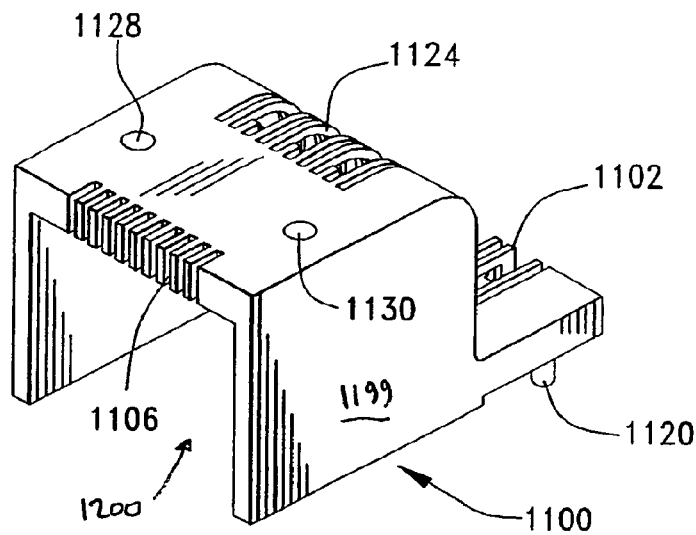
FIG.57
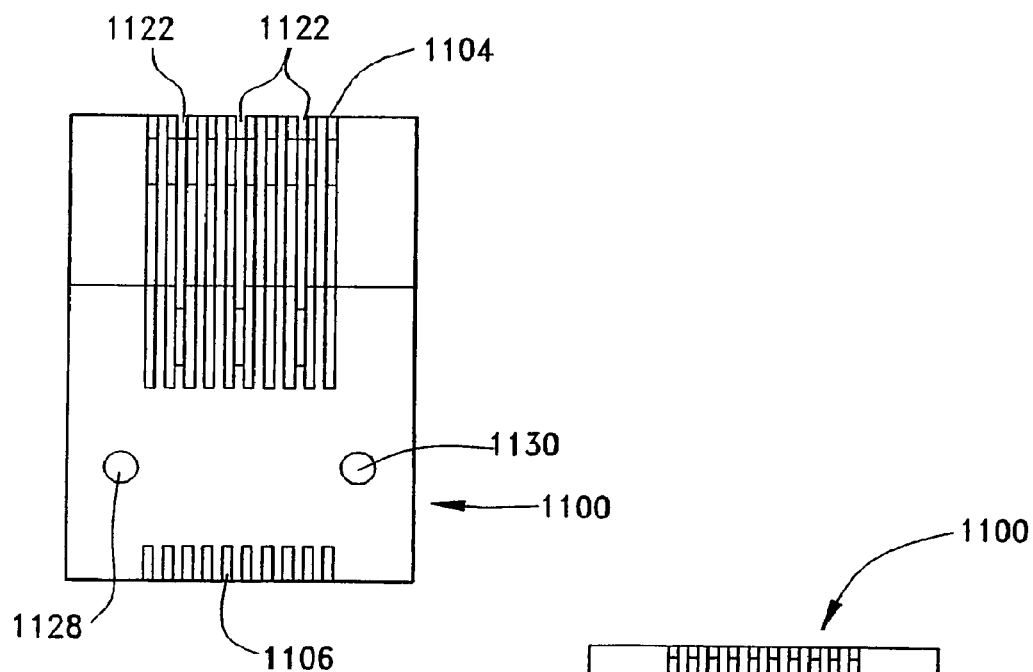
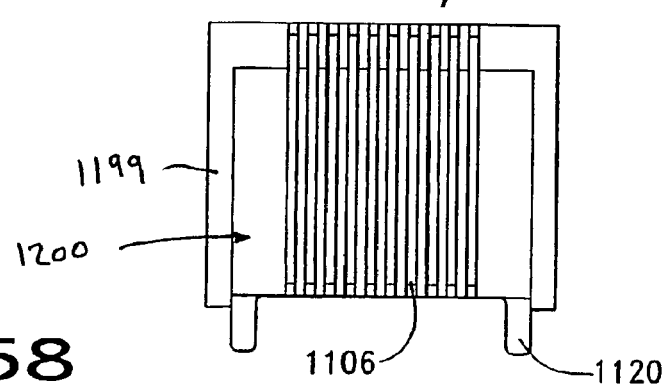
FIG.58

GROUPED ELEMENT TRANSMISSION CHANNEL LINK WITH PEDESTAL ASPECTS

RELATED APPLICATIONS

This application is a continuation of U.S. Ser. No. 11,804, 081, filed May 17, 2007, and which is incorporated by reference in its entirely and which is a divisional application of U.S. Ser. No. 10/515,299, filed Nov. 19, 2004, which in turn claims priority to PCT Internal App. No. PCT/US2004/007841, filed Mar. 15, 2004.

BACKGROUND OF THE INVENTION

The present invention pertains to multi-circuit electronic communication systems, and more particularly, to a dedicated transmission channel structure for use in such systems.

Various means of electronic transmission are known in the art. Most, if not all of these means suffer from inherent speed limitations, such as both the upper frequency limit and the actual time a signal requires to move from one point to another within the system, which is commonly referred to as propagation delay. They simply are limited in their electronic performance primarily by their structure, and secondarily by their material composition. One traditional approach utilizes conductive pins, such as those found in an edge card connector, as such as illustrated in FIG. 1. In this type of structure a plurality of conductive pins, or terminals 20 are arranged within a plastic housing 21 and this arrangement provides operational speeds of about 800 to 900 MHz. An improvement upon this standard structure is represented by edge card connectors that may be known in the art as "Hi-Spec" and which are illustrated in FIG. 2, in which the system includes large ground contacts 25 and small signal contacts 26 disposed within an insulative connector housing 27. The signal contacts in these structures are not differential signal contacts, but are merely single-ended signal, meaning that every signal contact is flanked by a ground contact. The operational speeds for this type of system are believed to be about 2.3 Ghz.

Yet another improvement in this field is referred to a "triad" or "triple" connector in which conductive terminals are disposed within a plastic housing 28 in a triangular pattern, and the terminals include a large ground terminal 29, and two smaller differential signal terminals 30, as illustrated in FIG. 3, and, as described in greater detail U.S. Pat. No. 6,280,209. This triad/triple structure has an apparent upper limit speed of about 4 Ghz. All three of these approaches utilize, in the most simplest sense, conductive pins in a plastic housing in order to provide a transmission line for electronic signals.

In each of these type constructions, it is desired to maintain a dedicated transmission line through the entire delivery path of the system, including through the circuit board(s), the mating interface and the source and load of the system. It is difficult to achieve the desired uniformity within the system when the transmission system is constructed from individual pins. Discrete point-to-point connections are used in these connectors for signal, ground and power. Each of these conductors was designed as either a conductor or a means of providing electrical continuity and usually did not take into account transmission line effects. Most of the conductors were designed as a standard pinfield so that all the pins, or terminals, were identical, regardless of their designated electrical function and the pins were further arranged at a standard pitch, material type and length. Although satisfactory in performance at low operating speeds, at high operational speeds, these systems would consider the conductors as discontinuities in the system that affect the operation and speed thereof.

Many return signal terminals or pins in these systems were commoned to the same ground conductor, and thus created a high signal to ground ratio, which did not lend themselves to high speed signal transmission because large current loops are forced between the signals and the ground, which loops reduce the bandwidth and increase the crosstalk of the system, thereby possibly degrading the system performance.

Bandwidth ("BW") is proportional to $1\sqrt{LC}$, where L is the inductance of the system components, C is the capacitance of the system components and BW is the bandwidth. The inductive and capacitive components of the signal delivery system work to reduce the bandwidth of the system, even in totally homogeneous systems without discontinuities. These inductive and capacitive components can be minimized by reducing the overall path length through the system, primarily through limiting the area of the current path through the system and reducing the total plate area of the system elements. However, as the transmission frequency increases, the reduction in size creates its own problem in that the effective physical length is reduced to rather small sizes. High frequencies in the 10 Ghz range and above render most of the calculated system path lengths unacceptable.

In addition to aggregate inductance and capacitance across the system being limiting performance factors, any non-homogeneous geometrical and/or material transitions create discontinuities. Using 2.5 Ghz as a minimum cutoff frequency in a low voltage differential signal system operating at around 12.5 Gigabits per second (Gbps), the use of a dielectric with a dielectric constant of about 3.8 will yield a critical path length of about 0.24 inches (6.1 mm), over which length discontinuities may be tolerated. This dimension renders impracticable the ability of one to construct a system that includes a source, transmission load and load within the given quarter-inch. It can thus be seen that the evolution of electronic transmission structures have progressed from uniform structured pin arrangements to functionally dedicated pins arrangements to attempted unitary structured interfaces, yet the path length and other factors still limit these structures.

In order to obtain an effective structure, one must maintain a constant and dedicated transmission line over the entire delivery path: from the source, through the interface and to the load. This would include the matable interconnects and printed circuit boards. This is very difficult to achieve when the delivery system is constructed from individual, conductive pins designed to interconnect with other individual conductive pins because of potential required changes in the size, shape and position of the pins/terminals with respect to each other. For example, in a right angle connector, the relationship between the rows of pins/terminals change in both the length and the electrical coupling. High speed interconnect design principles that include all areas between the source and load of the system including printed circuit boards, board connectors and cable assemblies are being used in transmission systems with sources of up to 2.5 Gbps. One such principle is the principle of ground by design which provides added performance over a standard pin field in that coupling is enhanced between the signal and ground paths and single-ended operation is complimented. Another principle being used in such systems includes impedance tuning to minimize discontinuities. Yet another design principle is pinout optimization where signal and return paths are assigned to specific pins in the pin field to maximize the performance.

These types of systems all are limited with respect to attaining the critical path lengths mentioned above. The present invention is directed to an improved transmission or delivery system that overcomes the aforementioned disadvantages and which operates at higher speeds and in which the transmission line is incorporated into a pedestal connector.

SUMMARY OF THE INVENTION

The present directed is therefore directed to an improved transmission structure that overcomes the aforementioned disadvantages and utilizes grouped electrically conductive elements to form a unitary mechanical structure that provides a complete electronic transmission channel that is similar in one sense to a fiber optic system. The focus of the invention is on providing a complete, copper-based electronic transmission channel that may be incorporated into a physical connector structure, as opposed to providing individual inductive pins, separable interfaces with copper conductors, each embedded in the transmission channel yielding more predictable electrical performance and greater control of operational characteristics. Such improved systems of the present invention are believed to offer operating speeds for digital signal transmission of up to 12.5 G at extended path lengths which are greater than 0.24 inch (6.1 mm).

Accordingly, it is a general object of the present invention to provide an engineered waveguide that functions as a grouped element channel link, wherein the link includes a dielectric body portion that is formed into a connector body and at least two conductive elements disposed thereon in a spaced-apart order along an exterior surface thereof.

Another object of the present invention is to provide a high-speed signal transmission line channel link having an elongated body portion of a given cross-section throughout its length, the body portion being formed from a dielectric with a selected dielectric constant, and the link having, in its most basic structure, two conductive elements disposed on the exterior surface thereof, the elements being of similar size and shape and oriented thereon, in opposition to each other, so as to steer the electrical energy wave traveling through the link by establishing particular electrical and magnetic fields.

Yet another object of the present invention is to provide a improved electrical transmission channel incorporated into a pedestal-style connector structure for providing a "stepped" transmission channel between two distinct and spaced-apart levels, the connector structure including a dielectric substrate, and a plurality of grooves formed in the substrate, the grooves having opposing sidewalls, the sidewalls of the grooves having a conductive material deposited thereon, such as by plating, to form distinct electronic transmission channels within the grooves.

A still further object of the present invention is to provide a pre-engineered wave guide in which at least a pair of conductive elements are utilized to provide differential signal transmission, i.e., signal in ("+") and signal out ("−"), the pair of conductive elements being disposed on the exterior of the dielectric body so as to permit the establishment of capacitance per length, inductance per length, impedance, attenuation and propagation delay per unit length, and establishing these pre-determined performance parameters within the channels formed by the conductive elements.

Yet another object of the present invention is to provide a non-circular transmission line for high speed applications, which includes an elongated rectangular or square dielectric member having an exterior surface with at least four distinct sectors disposed thereon, the dielectric member including a pair of conductive elements aligned with each other and disposed on two of the sectors, while separated by an intervening sector.

A further object of the present invention is to provide one or more grouped element channel links in the form of high-speed transmission lines along an elongate body of insulating plastic material with at least one bend in the elongate body to transfer signals along the grouped element channel links in both the vertical and the horizontal directions.

A still further object of the present invention is to provide a frame of a plastic material that may be selectively plated with metal to define one or more grouped element channel links along raised elements in the frame by over-molding the plastic frame with a non-plateable plastic material and plating the exposed raised elements of the frame with metal.

A yet further object of the present invention is to provide one or more grouped element channel links in the form of high-speed transmission lines along a pedestal formed of an insulative material with at least one bend formed in the pedestal in order to transfer signals along the grouped element channel links in both vertical and the horizontal directions.

Another object of the present invention is to provide one or more grouped element channel links in the form of high-speed transmission lines along an insulative support pedestal or along an elongate body of insulating plastic material where the grouped element channel links include a pair of spaced-apart low impedance conductive traces, such as for ground or power, the spaced-apart conductive traces being separated by intervening air gaps and the support structure being configured to provide a trace path in which the traces make at least one change in direction.

Yet another object of the present invention is to provide one or more grouped element channel links in the form of high-speed transmission lines along a pedestal or along an elongate body of insulating plastic material that accommodates both high speed signals along the grouped channel links and slower speed signals along other conductive traces also formed in the pedestal or elongate body.

The present invention accomplishes the above and other objects by virtue of its unique structure. In one principal aspect, the present invention includes a transmission line that is formed from a dielectric with a preselected dielectric constant and a preselected cross-sectional configuration. A pair of conductive surfaces are disposed on the dielectric line, or link, and one preferably aligned with each other and separated from each other. The conductive surfaces serve as wave guides for guiding electrical waves along the transmission link.

In another principal aspect of the present invention, the conductive elements are grouped together as a pair on a single element, thus defining a unitized wave guide that may be run between and among successive printed circuit boards and connected thereto without difficulty. The conductive surfaces may be formed by selectively depositing conductive material thereon, such as by plating, the exterior surface of the dielectric body, or by molding or otherwise attaching an actual conductor to the body. In this manner, the dielectric may be formed with bends and the conductive surfaces that exist on the surface thereof maintains their spaced apart arrangement of grouped channel conductors through the bends.

In yet another principal aspect of the invention, the exterior of the transmission line may be covered by a protective outer jacket, or sleeve. The conductive surfaces may be disposed on the dielectric body in a balanced arrangement with equal widths, or an unbalanced arrangement with a pair of conductive elements of different widths. Three conductive elements may be disposed on the dielectric body to support a differential triple on the transmission line utilizing a pair of differential signal conductors and an associated ground conductor. The number of conductive surfaces is limited only by the size of the dielectric body, and four such discrete conductive elements may be used to support two different signal channels or a single differential pair with dual grounds.

In still another principal aspect of the present invention, a unitary transmission line is formed within one cavity, or a plurality of selectively-sized metallized cavities formed within a substrate. The substrate is grooved to form the cavities and the sidewalls of the grooves may be plated with a conductive material. The air gap between the sidewalls of the cavities, or grooves, in this instance, serves as the dielectric of the transmission channel.

In yet another principal aspect of the present invention, the aforementioned transmission links may be used to carry power. In such circumstances, the underlying transmission line will include a grooved dielectric, with a continuous contact region being formed within the grooves, i.e., covering the sidewalls and bass of the groove. The continuous contact area that is present on these three surfaces for the length of the groove extends the current carrying capability of the structure. A ground plane may be utilized to increase capacitive coupling among the power channels and the ground plane to reduce the source impedance of the overall structure. The transmission line may be formed with projecting ridges, or lands, that serve to define troughs therebetween. The conductive surfaces are formed in the troughs by way of a continuous process, such a selective plating so that a continuous plated trough, i.e., two sidewalls and an interconnecting base are formed which extend for the length of the transmission line. This increases the current carrying capability. A high capacitance may then be created across the dielectric to reduce the source impedance of the system.

The power carrying aspect of the invention may be further supplemented by the forming of high density contact sets within the system. In a grooved transmission line the opposing sidewalls of the grooves may be plated with a conductive material to form continuous contacts that extend the length of the transmission line and opposite polarity signals (i.e., "+" and "−") may be carried along the contacts. A plug assembly may be molded, such as by way of insert molding into the grooves, either individually or as an assembly encompassing two or more such grooves to insulate and isolate the opposed contact pairs, which will result in an increased voltage standoff. A conformal coating may also be used to achieve a similar aim.

The transmission lines of the invention may carry both signals and power and thus may be easily divided into separate signal channels and power channels. The signal channels may be made with conductive strips or paths of a preselected width, while the power channels, in order to carry high currents, may include either wider strips or an enlarged, continuous conductor strip. The wider strips are enlarged plate areas as compared to the signal strips and have a high capacitance. The signal and power channels may be separated by a wide, non-conductive area of the transmission line that serves as an isolation region. Because the isolation region may be formed during the forming of the underlying dielectric base, the isolation region may be readily defined to minimize cross-contamination or electrical interference.

In accordance with another aspect of the present invention, and with respect to an embodiment that pertains to a pedestal-style connector, an over-molded connector may have an elongated frame member formed from a material that can be plated with metal to form conductors for carrying high-frequency electronic signals. The frame member may be formed from a catalyzed resin with a set of raised ribs formed along at least one side of the frame member. Preferably, at least some of the channels defined between the raised ribs are deeper than the other channels, such that the sidewalls of these deeper channels may be plated with metal to provide conductive channel elements with high-frequency electronic signal characteristics, much like a waveguide. The ribs may be disposed on both sides of the frame member and run in the elongated direction of the frame member. One of the sets of the raised ribs may wrap around one end of the frame member from the top surface to the bottom surface to terminate near the other set of raised ribs to provide a contact area on the underside of the frame member. Likewise, the other set of raised ribs may wrap around the other end of the frame member from the bottom side to the top side to provide a second contact area on the top surface of the frame member. Preferably, at least one angular bend is provided across the frame member and across the raised ribs such that the frame member may interface with and conduct electronic signals in both the horizontal and vertical directions.

The over-molded connector may then be formed by selectively over-molding the frame member with an insulative material, such as with a non-catalyzed resin. In this over-molding process, the channels between the raised ribs are filled with the non-catalyzed resin, leaving the tops of the ribs with the catalyzed resin exposed. However, the deeper channels that are to have their sidewalls plated with metal to form the channel links are not filled with the insulative resin. These exposed areas of catalyzed resin left after the over-molding process are then plated with metal. Thus, metallic conductors are formed on the raised ribs and on the sidewalls of the deeper channels. High-frequency differential signals may be conducted along these channel elements. Any metal that accumulates in the bottom of the deeper channels may be removed by known techniques. Preferably, at least one conductor on a raised rib is disposed between each pair of channel elements, with the conductor on the raised rib has a low impedance, such as may be expected for a ground or power source. The channel elements will have an air as their dielectric material and so the differential signals in the channel elements will have a greater affinity for the low impedance conductors located adjacently to the channel elements thereby reducing the impedance of the connector and improving the transmission of the high-frequency signals through the over-molded connector. The over-molded connector may also be fabricated as a pedestal connector.

The present invention also includes the related processes of forming the over-molded connector. Although such over-molding is only the preferred manner of constructing connectors of the invention. The frame member is first molded from a catalyzed resin material with the afore-mentioned characteristics, including the plurality of raised ribs disposed along at least one surface of the frame member with some channels defined by the raised ribs being of greater depth than other channels. One or more angular bends may be provided across the frame member and the raised rib to interface with and conduct electronic signals from different elevations, such as in both the horizontal and vertical directions. The frame member is then selectively over-molded with an electrically insulative compound, such as a non-catalyzed resin, including in the channels between the ribs, but not in the deeper channels that will be used to form high-frequency channel elements. The top surfaces of the ribs and the sidewalls of the deeper channels are next plated with conductive metal to form electrical conductors on the top surfaces of the ribs and to form channel elements in the deeper channels.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 56 is a perspective view of the alternate embodiment connector, but with the an outer covering molded over the frame of FIG. 55 and which may be mounted on the printed circuit board such as that illustrated in FIGS. 53 and 54;

FIG. 57 is a top plan view of the connector of FIG. 56; and,

FIG. 58 is an elevational end view of the connector of FIGS. 56 and 57.

DETAILED DESCRIPTION OF THE PREFERRED EMBODIMENTS

Figure 1:
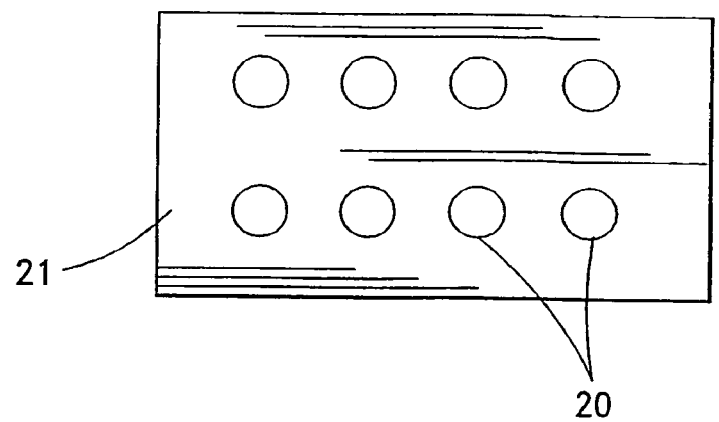
FIG. 1 is a schematic plan view of the terminating face of a conventional connector.
Figure 2:
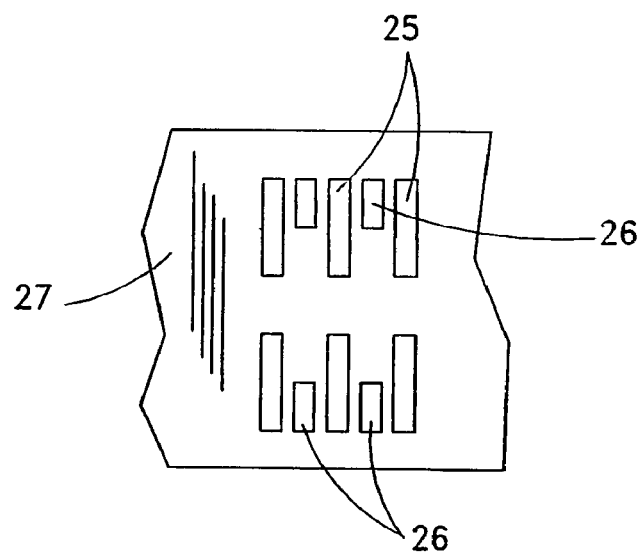
FIG. 2 is a schematic plan view of an edge card used in a high speed connector.
Figure 3:
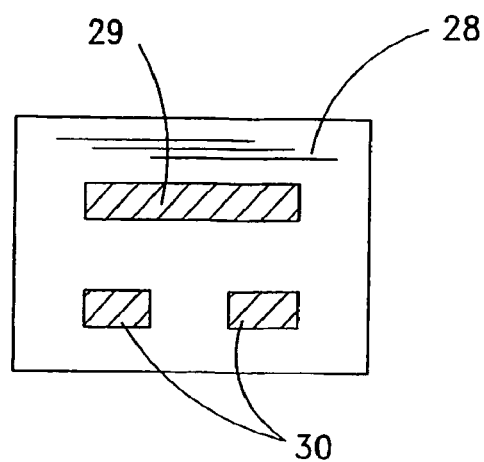
FIG. 3 is a schematic elevational view of a high speed connector utilizing a triad or triple.
Figure 4:
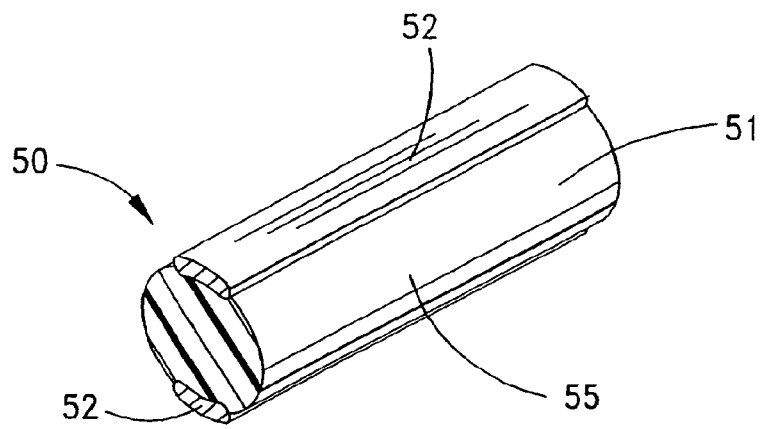
FIG. 4 is a perspective view of a grouped element channel link constructed in accordance with the principles of the present invention.
Figure 5:
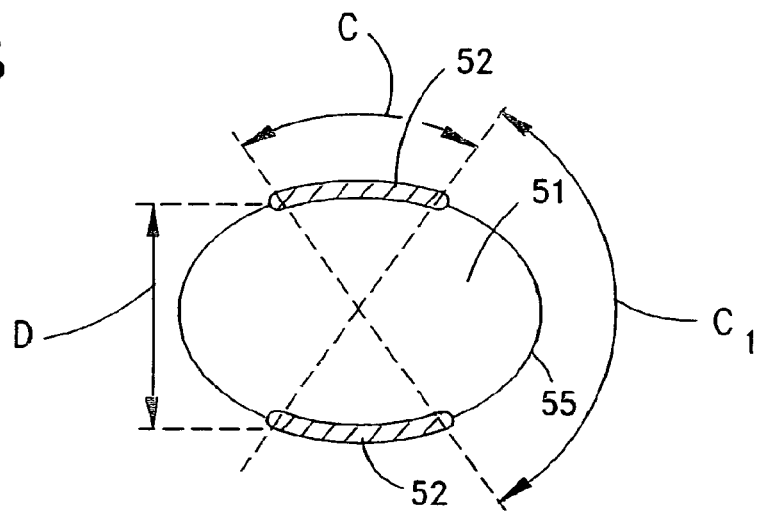
FIG. 5 is a schematic end view of the grouped element channel link of FIG. 4.

FIG. 4 illustrates a grouped element channel link 50 constructed in accordance with the principles of the present invention. It can be seen that the link 50 includes an elongated, dielectric body 51, preferably a cylindrical filament, that is similar to a length of fiber optic material. It differs therefrom in that the link 50 acts as a pre-engineered wave guide and a dedicated transmission media. In this regard, the body 51 is formed of a dedicated dielectric having a specific dielectric constant and a plurality of conductive elements 52 applied thereto. In FIGS. 4 and 5, the conductive elements 52 are illustrated as elongated extents, or strips, 52 of conductive material and, as such, they may be traditional copper or precious metal extents having a definite cross-section that may be molded or otherwise attached, such as by adhesive or other means to the dielectric body of the link 50. They may also be formed on the exterior surface 55 of the body 51 such as by a suitable plating process. At least two such conductors are used on each link, typically are used for signal conveyance of differential signals, such as +0.5 volts and −0.5 volts. The use of such a differential signal arrangement permits us to characterize structures of this invention as pre-engineered waveguides that are maintained over the entire length of the signal delivery path. The use of the dielectric body 51 provides for the reduction and also for preferred coupling to occur within the link. In the simplest embodiment, as illustrated in FIG. 5, the conductive elements are disposed on two opposing faces, so that the electrical affinity of each of the conductive elements is for each other through the dielectric body upon which they are supported, or in the case of a conductive channel as will be explained in greater detail to follow and as illustrated in FIGS. 29-30, the conductive elements are disposed on two or more interior faces of the cavity/cavities to establish the primary coupling mode across the cavity gap and through an air dielectric. In this manner, the links of the present invention may be considered as the electrical equivalent to a fiber optic channel or extent.

As such, the effectiveness of the links of the present invention are dependent upon the guiding and maintenance of digital signals through the channel link. This will include maintaining the integrity of the signal, controlling the emissions and minimizing loss through the link. The channel links of the present invention contain the electromagnetic fields of the signals transmitted therethrough by controlling the material of the channel link and the geometries of the system components so that preferred field coupling will be provided.

As illustrated better in FIG. 5, the two conductive surfaces 52 are arranged on the dielectric body 51 in opposition to each other. This is representative of a balanced link of the invention where the circumferential, or arcuate extent C of the conductive surfaces 52 is the same, as is the circumferential or arcuate extent C1, of the non-conductive exterior surfaces 55 of the dielectric body 51. This length may be considered to define a gross separation D between the conductive surfaces. As will be explained below, the link may be unbalanced with one of the conductive surfaces having an arc length that is greater than the other. In instances where the dielectric body and link are circular, the link may serve as a contact pin and so be utilized in connector applications. This circular cross-section demonstrates the same type of construction as a conventional round contact pin.

Figure 6:
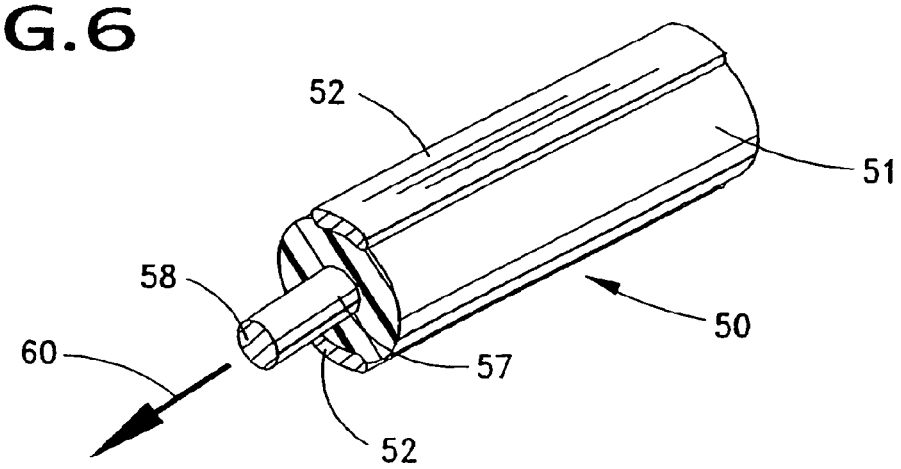
FIG. 6 is a perspective view of an alternate embodiment of a grouped element channel link constructed in accordance with the principles of the present invention.

As illustrated in FIG. 6, the links of the present invention may be modified to provide not only multiple conductive elements as part of the overall system transmission media, but may also incorporate a coincident and coaxial fiber optic wave guide therewithin for the transmission of light and optical signals. In this regard, the dielectric body 51 is cored to create a central opening 57 through which an optical fiber 58 extends. Electrical signals may be transmitted through this link as well as light signals 60.

Figure 7:
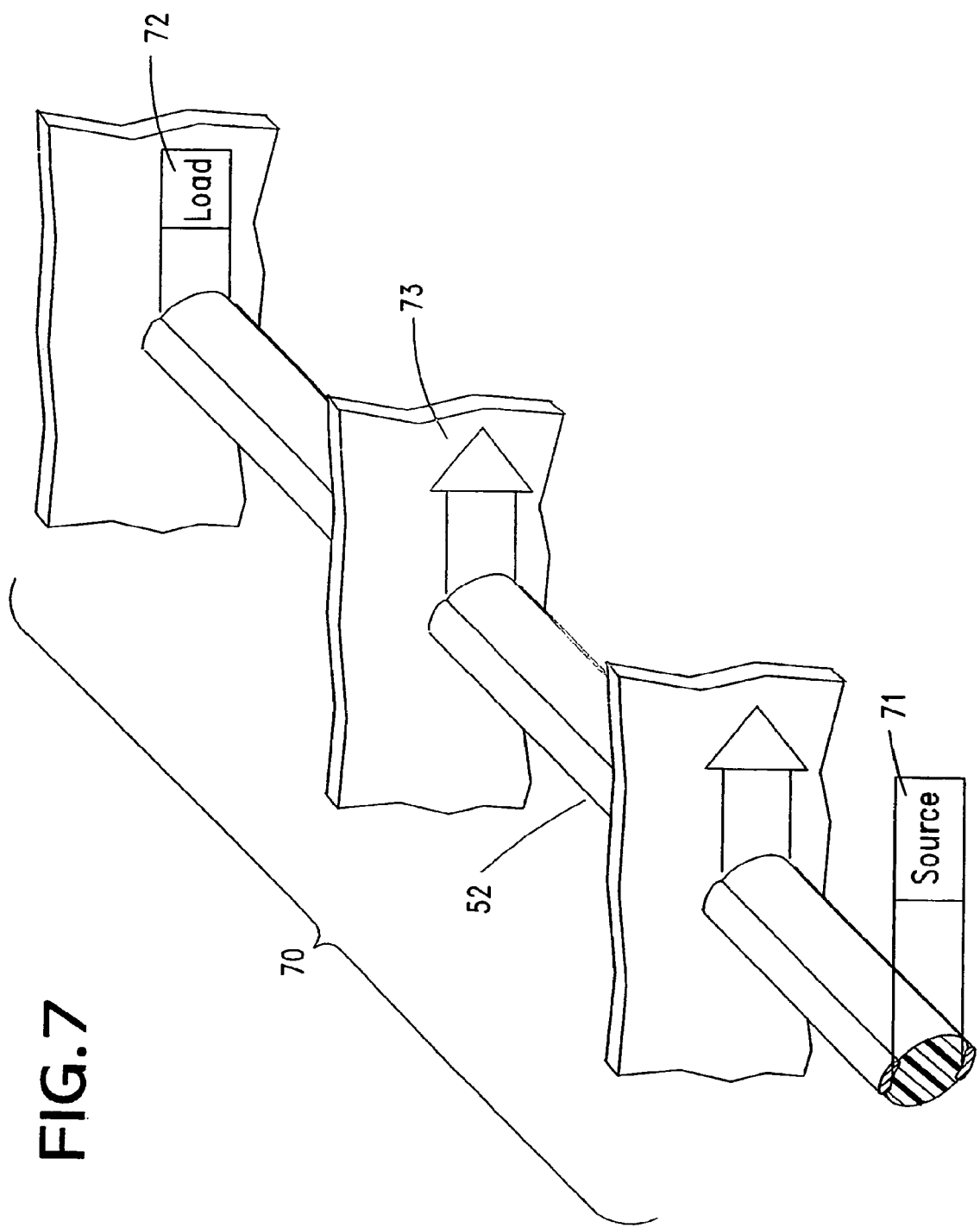
FIG. 7 is a schematic view of a transmission link of the present invention used to connect a source with a load having intermediate loads on the transmission link.

FIG. 7 schematically illustrates a transmission line 70 incorporating a link 50 of the present invention that extends between a source 71 and a load 72. The conductive surfaces 52 of the link serve to interconnect the source and load together, as well as other secondary loads 73 intermediate the source and the load. Such secondary loads may be added to the system to control the impedance through the system. A line impedance is established at the source and may be modified by adding secondary loads to the transmission line.

Figure 8:
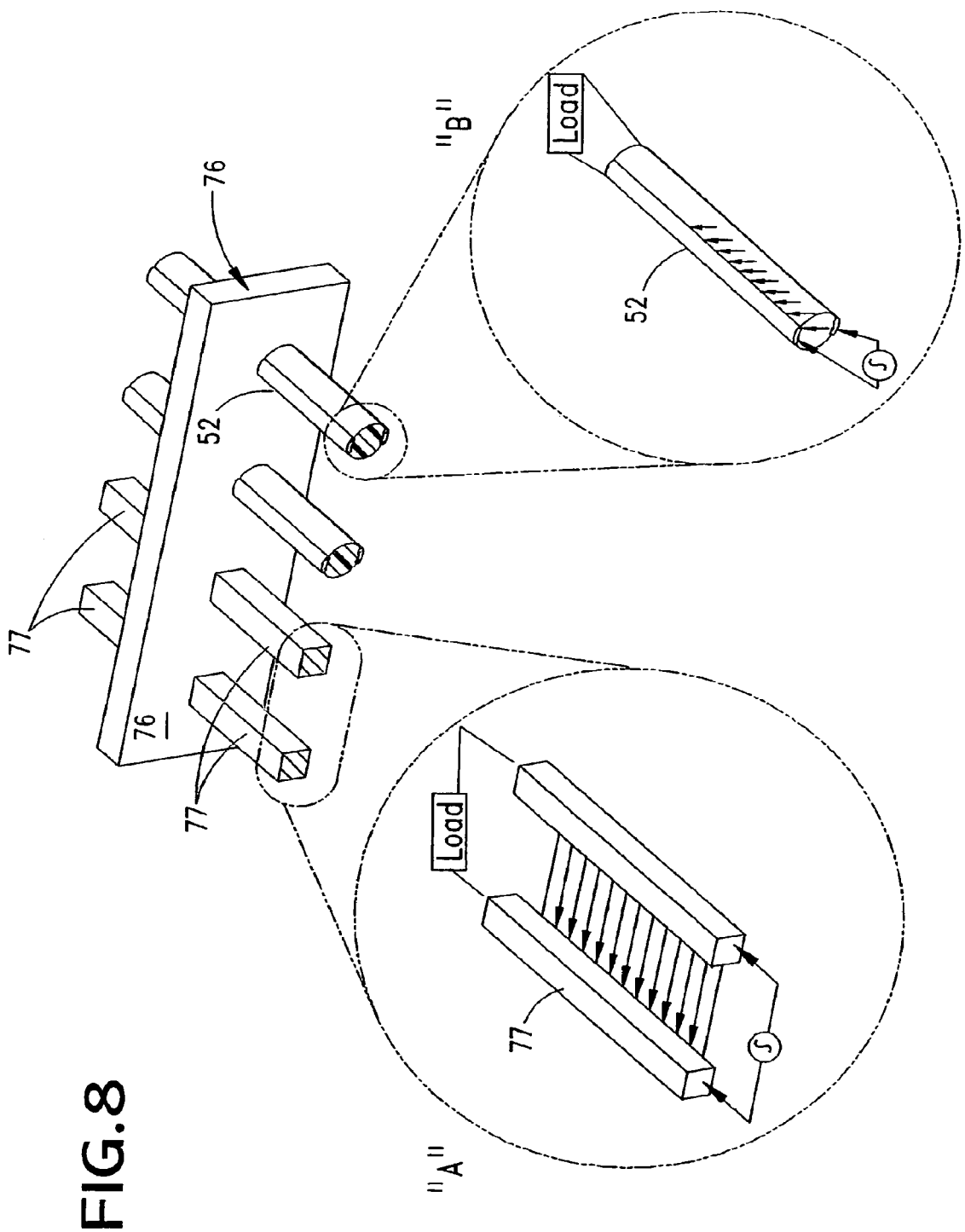
FIG. 8 is a schematic view of a connector element utilizing both conventional contacts "A" and the transmission links "B" of the invention, with enlarged detail portions at "A" and "B" thereof, illustrating the occurrence of inductance in the respective systems.

FIG. 8 illustrates, schematically, the difference between the links of the present invention and conventional conductors, which are both illustrated in a dielectric block 76. Two discrete, conventional conductors 77 formed from copper or another conductive material extend through the block 76. As shown in enlargement "A", the two discrete conductor presents an open cell structure with a large inductance (L) because of the enlarged current loop. Quite differently, the links of the present invention have a smaller inductance (L) at a constant impedance due to the proximity of the conductive surfaces positioned as the dielectric body 51. The dimensions of these links 50 can be controlled in the manufacturing process and extrusion will be the preferred process of manufacturing with the conductive surfaces being extended with the dielectric body or separately applied of the extrusion, such as by a selective plating process so that the resulting construction is of the plated plastic variety. The volume of the dielectric body 51 and the spacing between conductive elements disposed thereon may be easily controlled in the extrusion process.

Figure 9:
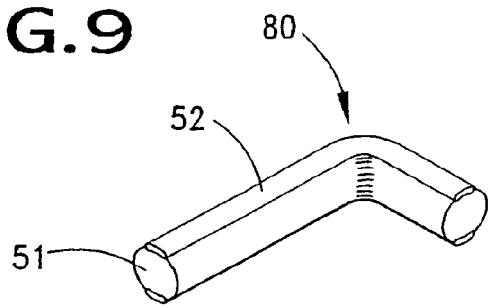
FIG. 9 is a perspective view of an alternate construction of a link of the invention with a right angle bend formed therein.

As FIG. 9 illustrates, the dielectric body may have a bend 80 forward therewith in the form of the 90° right-angle bend illustrated or in any other angular orientation. The dielectric body 51 and the conductive surfaces 52 are easily maintained through the bend.

Figure 10:
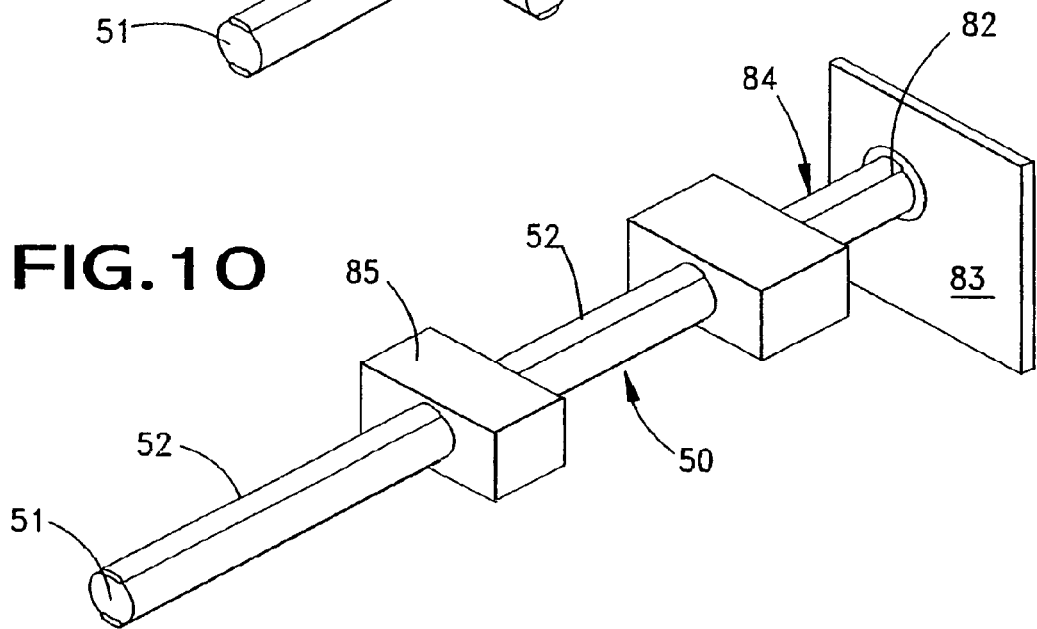
FIG. 10 is a schematic view of a transmission line utilizing the links of the present invention.

FIG. 10 illustrates a transmission line using the links of the invention. The link 50 is considered as a transmission cable formed from one or more single dielectric bodies 51, and one end 82 of it is terminated to a printed circuit board 83. This termination may be direct in order to minimize any discontinuity at the circuit board. A short transfer link 84 that maintains any discontinuities at a minimum is also provided. These links 84 maintain the grouped aspect of the transmission link. Termination interfaces 85 may be provided where the link is terminated to the connector with minimum geometry discontinuity or impedance discontinuity. In this manner, the grouping of the conductive surfaces is maintained over the length of the transmission line resulting in both geometric and electrical uniformity.

Figure 11:
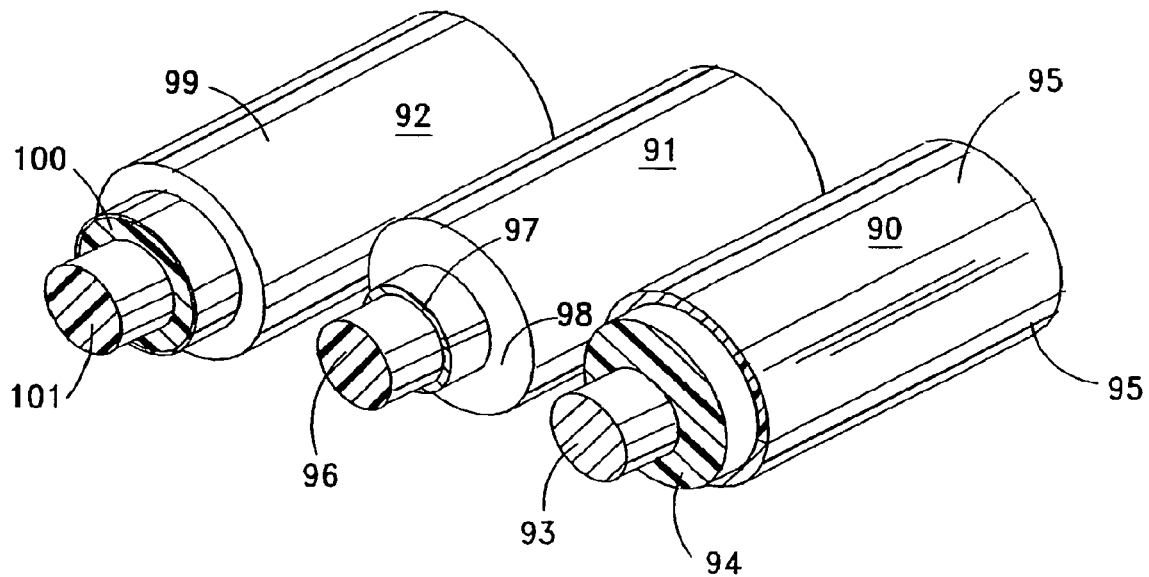
FIG. 11 is a perspective view illustrating alternate media compositions of the links of the invention.

FIG. 11 illustrates a variety of different cross-sections of the transmission links 50 of the invention. In the rightmost link 90, a central conductor 93 is encircled by a hollow dielectric body 94 which in turn, supports multiple conductive surfaces 95 that are separated by an intervening space, preferably filled with portions of the dielectric body 94. This construction is suitable for use in power applications where power is carried by the central conductor. In the middle link 91, the central cover 96 is preferably made of a selected dielectric and has conductive surfaces 97 supported on it. A protective outer insulative jacket 98 is preferably provided to protect and or insulate the inner link. The leftmost link 92 has a protective outer jacket 99 that enclosed a plateable polymeric ring 100 that encircles either a conductive or insulative core 101. Alternatively, one or the elements surrounding the core or of the link 92 may be filled with air and may be spaced away from an inner member by way of suitable standoffs or the like.

Figure 12:
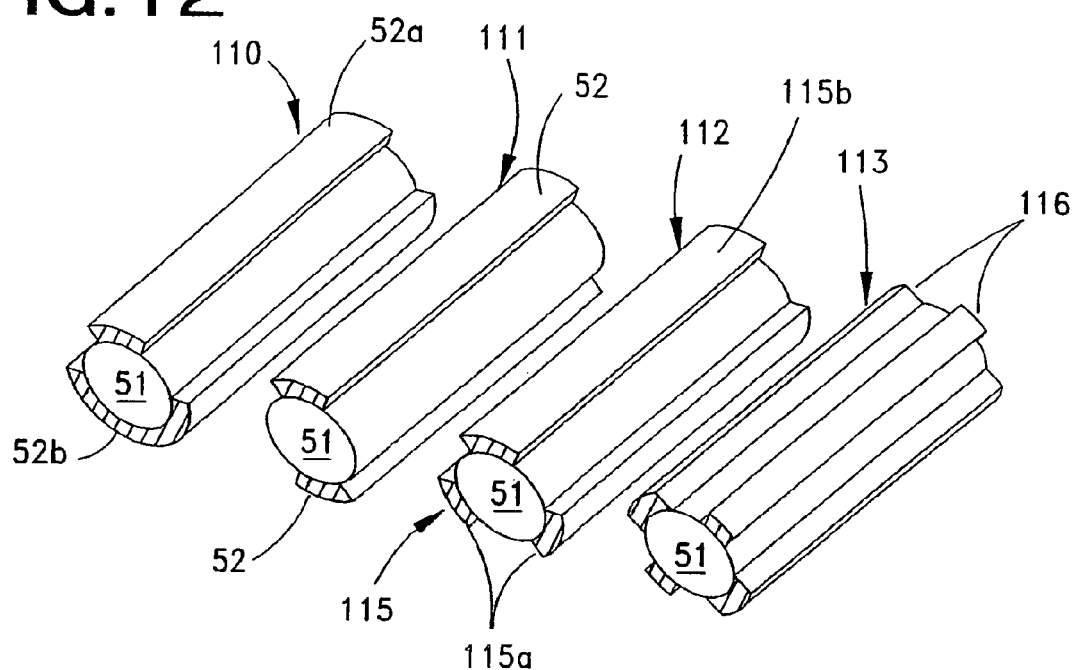
FIG. 12 is a perspective view of an array of different shapes of dielectric bodies illustrating alternate conductive surface arrangements.

FIG. 12 illustrates an array of links 110-113 that have their outer regions combined with the dielectric body 51 to form different types of transmission links. Link 110 has two conductive surfaces 52a, 52b of different arc lengths (i.e., unbalanced) disposed on the outer surface of the dielectric body 51 so that the link 110 may provide single ended operation. Link 111 has two equal spaced and sized (or "balanced") conductive elements 52 to provide an effective differential signal operation.

Link 112 has three conductive surfaces 115 to support a differential triple link operation of two differential signal conductors 115a and an assorted ground conductor 115b. Link 113 has four conductive surfaces 116 disposed on its dielectric body 51 in which the conductive surfaces 116 may either include two differential signal channels (or pairs) or a single differential pair with a pair of associated grounds.

Figure 13:
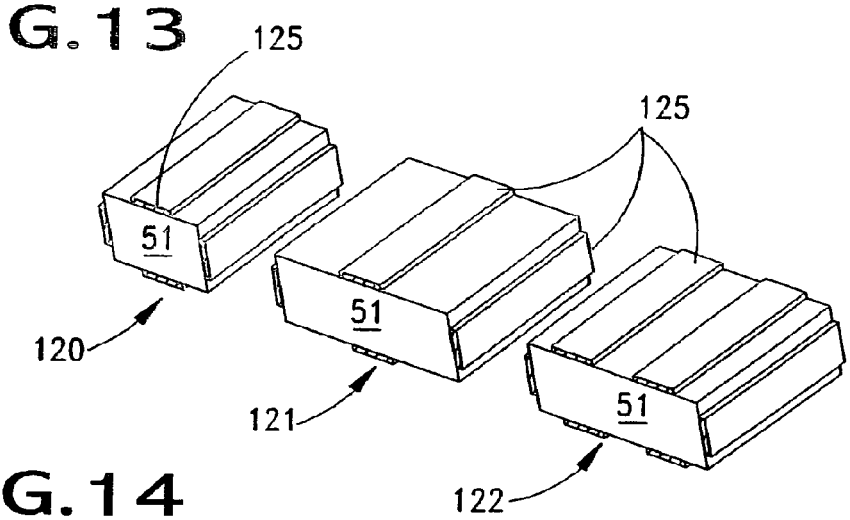
FIG. 13 is a perspective view of an array of non-circular cross-section dielectric bodies that may be used to form links of the invention.

FIG. 13 illustrates an array of one-type of non-circular links 120-122 that may have square configurations, as with link 120, or rectangular configurations, as with links 121-122. The dielectric bodies 51 may be extended with projecting land portions 125 that are plated or otherwise covered with conductive material. These land portions 125 may be used "key" into connector slots in a manner so that contact between the connector terminals (not shown) and the conductive faces 125 is easily affected.

Figure 14:
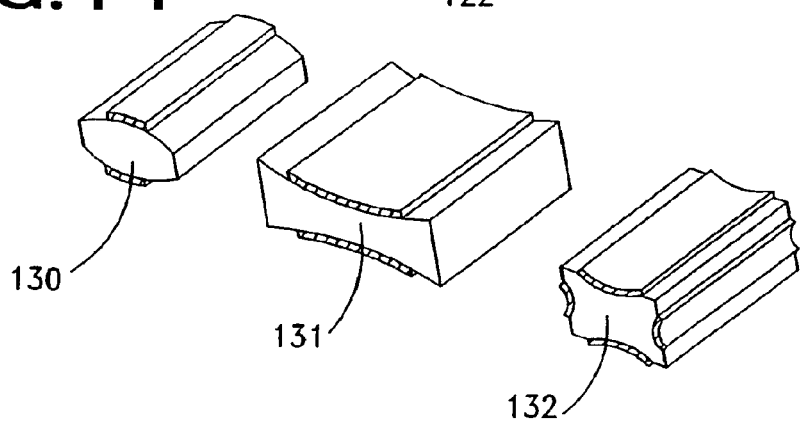
FIG. 14 is a perspective view of another array of non-circular cross-section dielectric bodies suitable for use as links of the invention.

FIG. 14 illustrates some additional dielectric bodies. One body 130 is shown as convex, which the other two bodies 131, 132 are shown. A circular cross-section of the dielectric bodies has a tendency to concentrate the electrical filed strength at the corners of the conductive surfaces, while a slightly convex form as shown for body 131, has a tendency to concentrate the field strength evenly, resulting in a lower and greater convexity, as illustrated in dielectric 132 may have beneficial cross talk reduction aspects because it focuses the electrical field inwardly.

Importantly, the transmission link may be formed as a single extrusion 200 (FIGS. 15-16) carrying multiple signal channels thereupon, with each such channel including a pair of conductive surface 202-203. These conductive surfaces 202, 203 are separated from each other by intervening body 204 that supports them, as well as web portions 205 that interconnect them together. This extrusion 200 may be used as part of an overall connector assembly 220, where the extrusion is received into a complementary shaped opening 210 formed in a connector housing 211. The inner walls of the openings 210 may be selectively plated, or contacts 212 may be inserted into the housing 211 to contact the conductive surfaces and provide, if necessary, surface mount or through hole tail portions.

Figure 17:
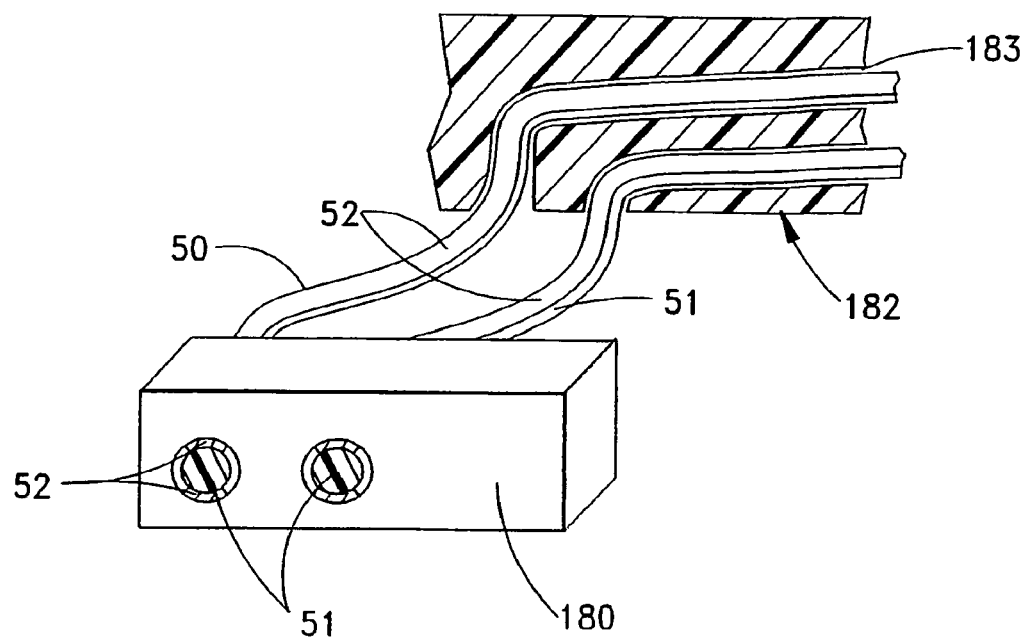
FIG. 17 is a diagrammatic view of a transmission channel of the present invention with two interconnecting blocks formed at opposite ends of the channel.

FIG. 17 illustrates the arrangement of two transmission channels 50 arranged as illustrated and terminated at one end to a connector block 180 and passing through a right angle block 182 that includes a series of right angle passages 183 formed therein which receive the transmission channel links as shown. In arrangements such as that shown in FIG. 17, it will be understood that the transmission channel links may be fabricated in a continuous manufacturing process, such as by extrusion, and each such channel may be manufactured with intrinsic or integrated conductive elements 52. In the manufacturing of these elements, the geometry of the transmission channel itself may be controlled, as well as the spacing and positioning of the conductive elements upon the dielectric bodies so that the transmission channels will perform as consistent and unitary electronic waveguides which will support a single channel or "lane" of signal (communication) traffic. Because the dielectric bodies of the transmission channel links may be made rather flexible, the systems of the invention are readily conformable to various pathways over extended lengths without significantly sacrificing the electrical performance of the system. The one connector endblock 180 may maintain the transmission channels in a vertical alignment, while the block 182 may maintain the ends of the transmission channel links in a right angle orientation for termination to other components.

Figure 18:
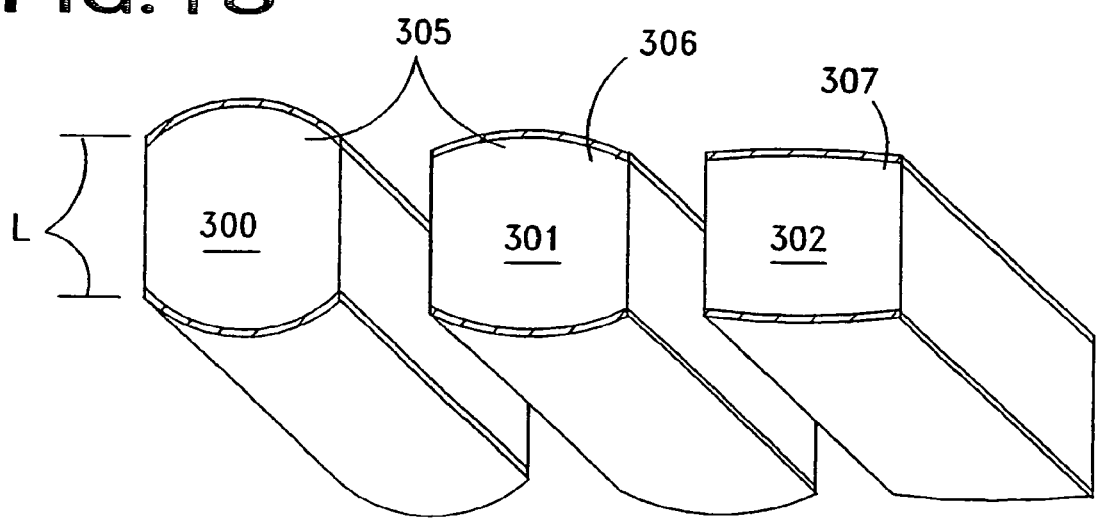
FIG. 18 is a perspective view of an array of different dielectric bodies that may be used as links of the with different lens characteristics.

FIG. 18 illustrates a set of convex dielectric blocks or bodies 300-302 in which separation distance L varies and the curve 305 of the exterior surfaces 306 of the blocks raises among the links 300-302. In this manner, it should be understood that the shapes of the bodies may be chosen to provide different lens characteristics.

Figure 19:
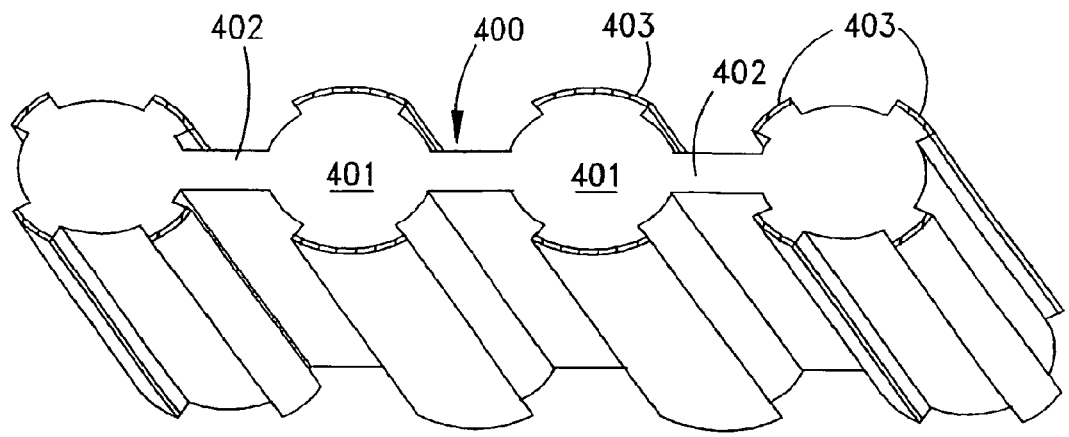
FIG. 19 is a perspective view of a multiple transmission link extrusion with different signal channels formed thereon.

FIG. 19 illustrates a multiple channel extrusion 400 with a series of dielectric bodies or blocks 401 interconnected by webs 402 in which the conductive surfaces 403 are multiple or complex in nature.

Figure 15:
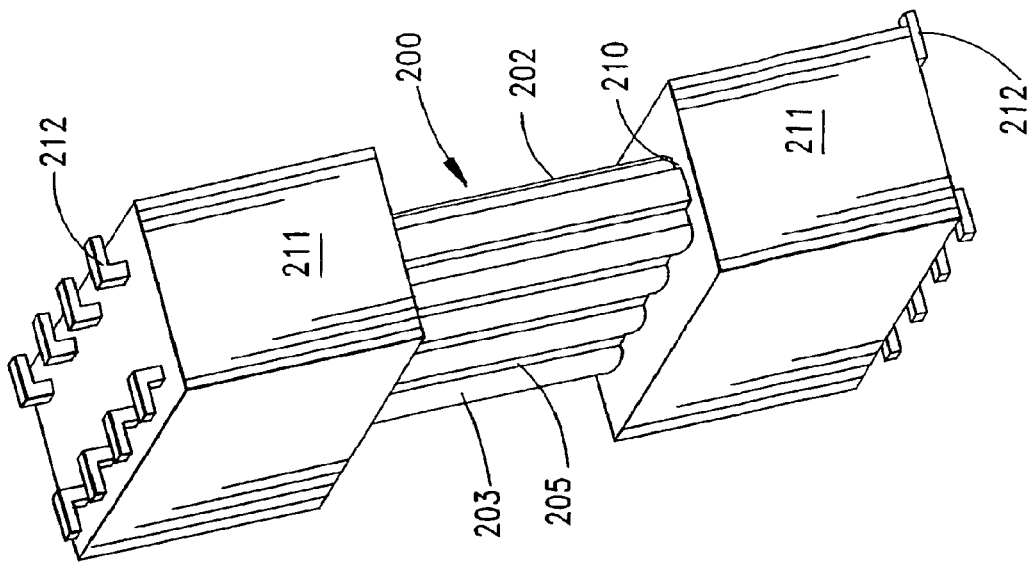
FIG. 15 is an exploded view of a connector assembly incorporating a multiple element link of the invention.
Figure 16:
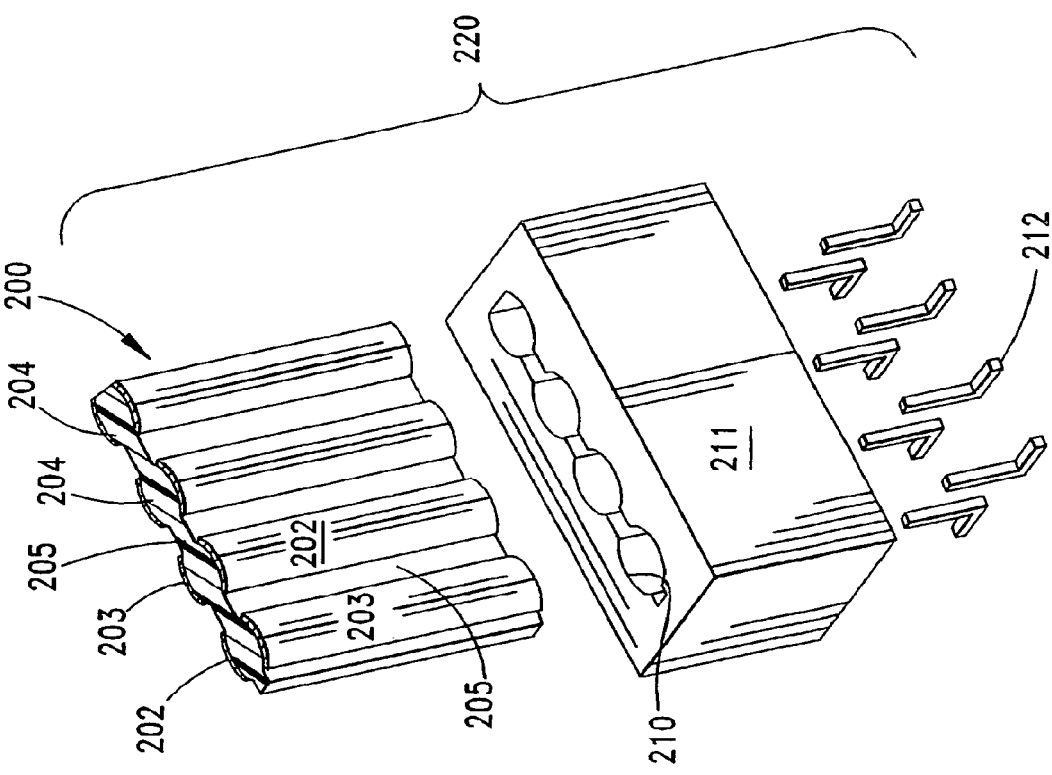
FIG. 16 is a perspective view of a connector assembly having two connector housings interconnected by a transmission link of the invention.
Figure 20:
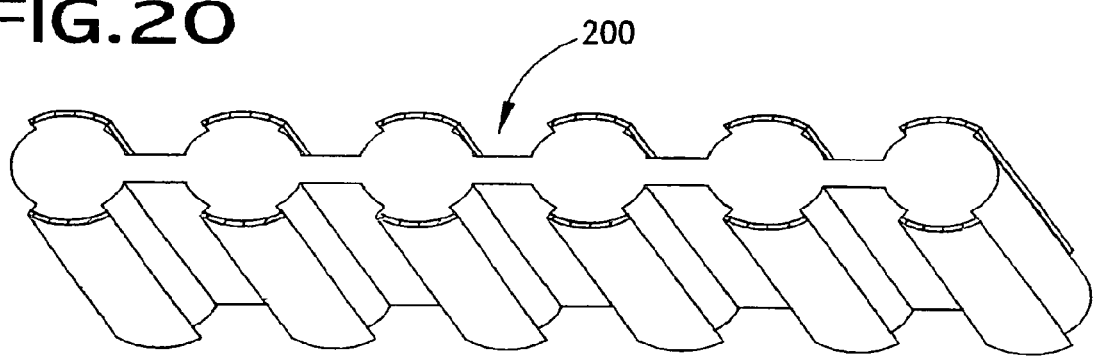
FIG. 20 is a perspective view of a multiple link extrusion used in the invention.

FIG. 20 illustrates standard extrusion 200 such as that shown in FIGS. 15 and 16.

Figure 21:
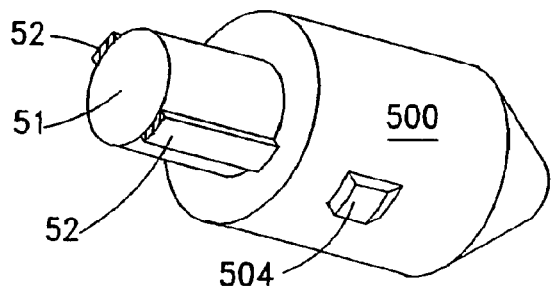
FIG. 21 is a perspective view of a mating interface used with a discrete one of the transmission links of the invention, in which mating interface takes the form of a hollow endcap.
Figure 22:
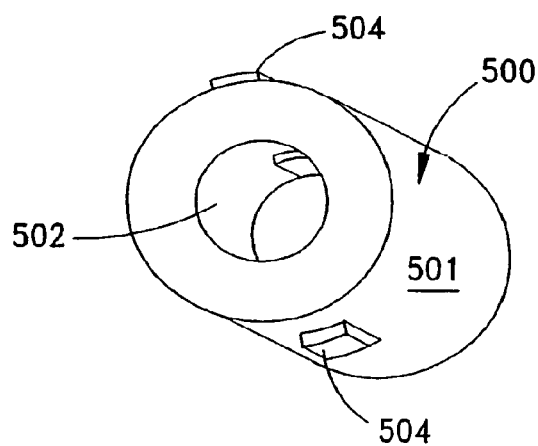
FIG. 22 is a rear perspective view of the end cap of FIG. 21, illustrating the center opening thereof that receives the transmission link.
Figure 23:
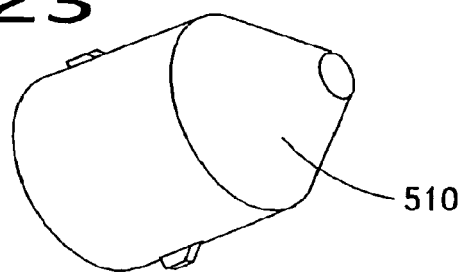
FIG. 23 is a frontal perspective view of the end cap of FIG. 21, illustrating the orientation of the exterior contacts.

The links of the present invention may be terminated into connector and other housings. FIGS. 21-23 illustrate one termination interface as a somewhat conical endcap which has a hollow body 501 with a central openings 502. The body may support a pair of terminals 504 that mate with the conductive surfaces 52 of the dielectric body 51. The endcap 500 may be inserted into various openings in connector housings and as such, preferably includes a conical insertion end 510.

Figure 24:
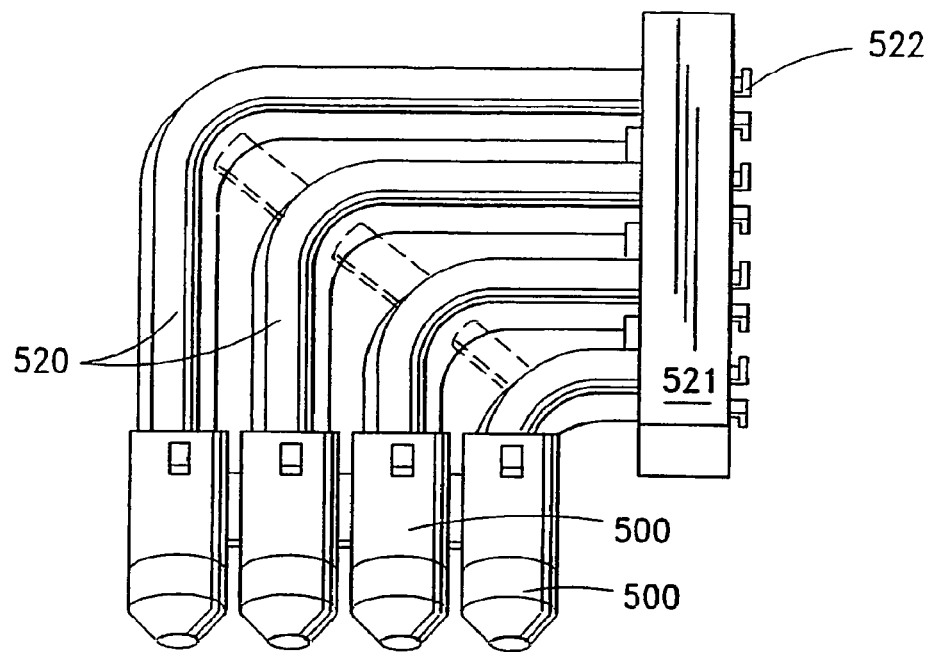
FIG. 24 is a plan view of a multiple transmission link right angle, curved connector assembly.

FIG. 24 illustrates the endcaps 500 in place on a series of links 520 that are terminated to an endblock 521 that has surface mount terminals 522.

Figure 25:
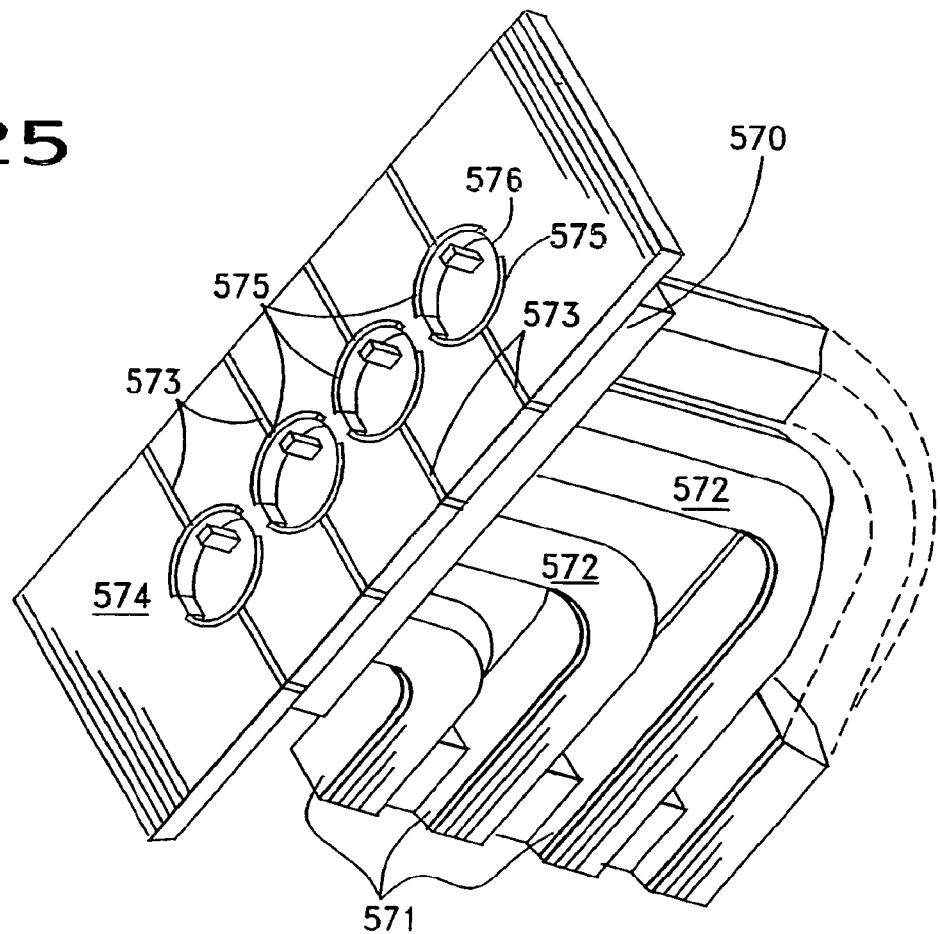
FIG. 25 is a perspective view of an alternate construction of one of the termination ends of the connector assembly.

FIG. 25 illustrates an alternate construction of an end block 570. In this arrangement, the transmission lines, or links 571, are formed from a dielectric and include a pair of conductive extents 572 formed on their exterior surfaces (with the extents 572 shown only on one side for clarity and their corresponding extents being formed on the surfaces of the links 571 that face the plane of the paper of FIG. 25). These conductive extents 572 are connected to traces 573 on a circuit board 574 by way of conductive vias 575 formed on the interior of the circuit board 574. Such vias may also be constructed within the body of the end block 570, if desired. The vias 575 are split and their two conductive sections are separated by an intervening gap 576 to maintain separation of the two conductive transmission channels at the level of the board.

Figure 26:
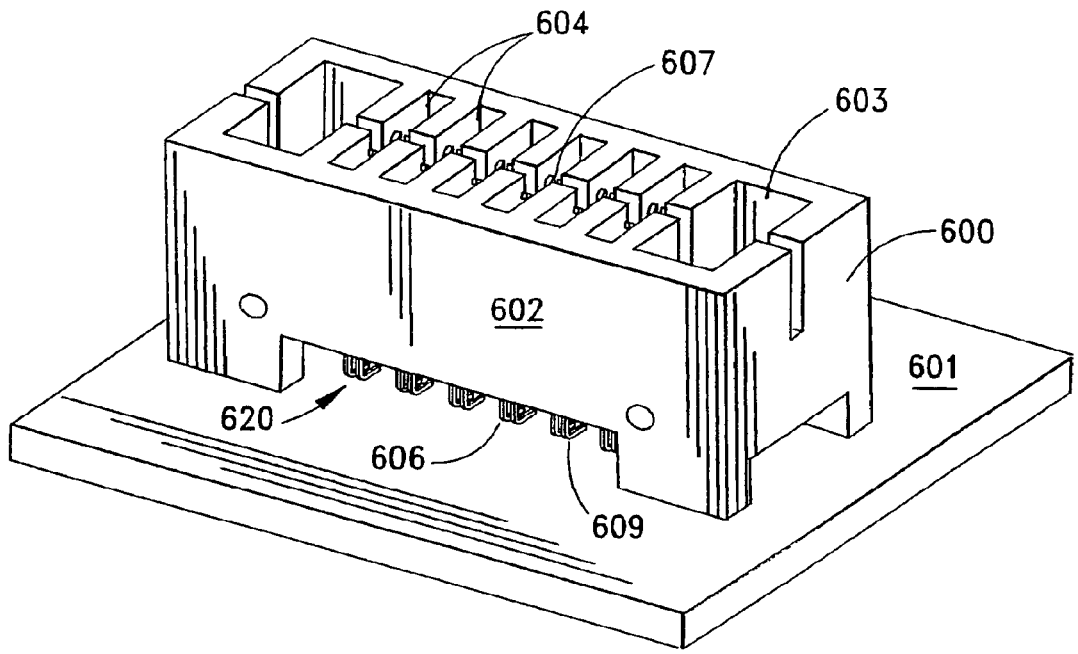
FIG. 26 is a perspective view of a connector suitable for use in connecting transmission channel links of the present invention to a circuit board.

FIG. 26 illustrates an end cap 600 mounted to a printed circuit board 601. This style of end cap 600 serves as a connector and thus includes a housing 602, with a central slot 603 with various keyways 604 that accept projecting portions of the transmission link. The end cap connector 600 may have a plurality of windows 620 for access to soldering the conductive tail portions 606 of the contacts 607. In instances of surface mount tails, the tails may have their horizontal parts 609 tucked under the body of the endcap housing to reduce the circuit board pad size needed, as well as the capacitance of the system at the circuit board.

Figure 27A:
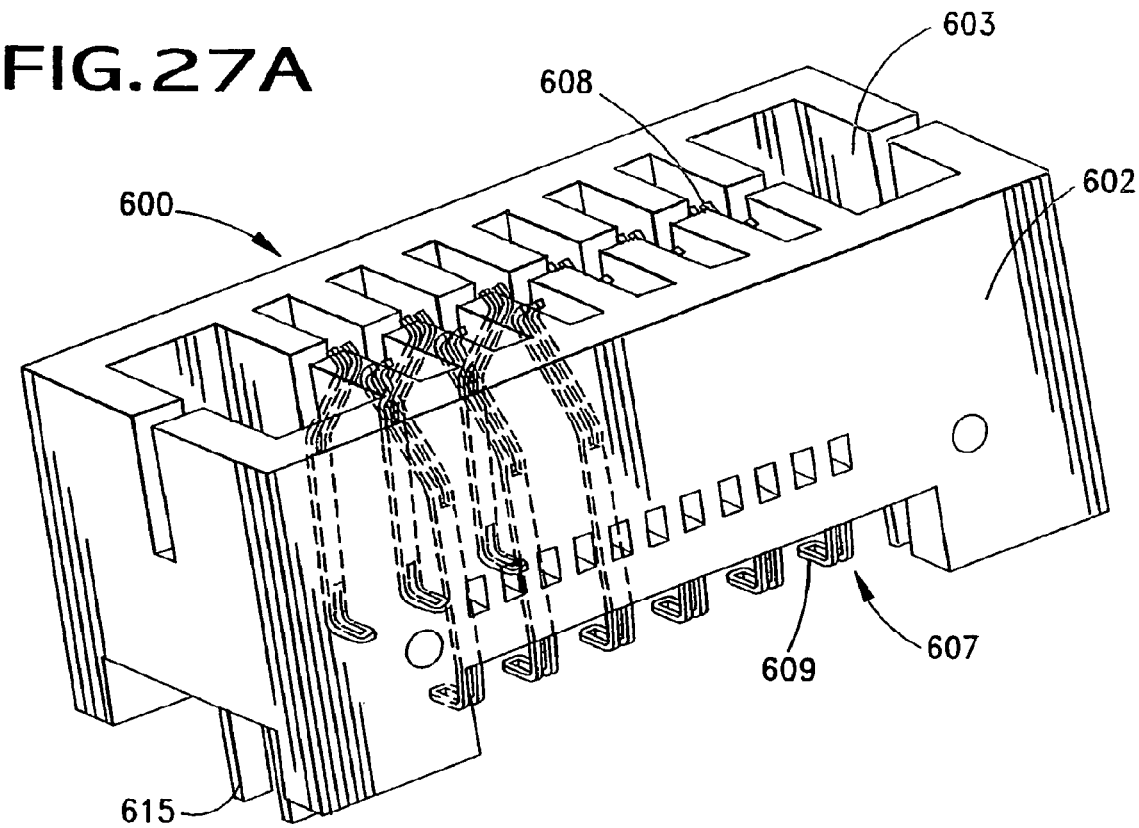
FIG. 27A is a skeletal perspective view of the connector of FIG. 26 illustrating the components that make up the connector.
Figure 27B:
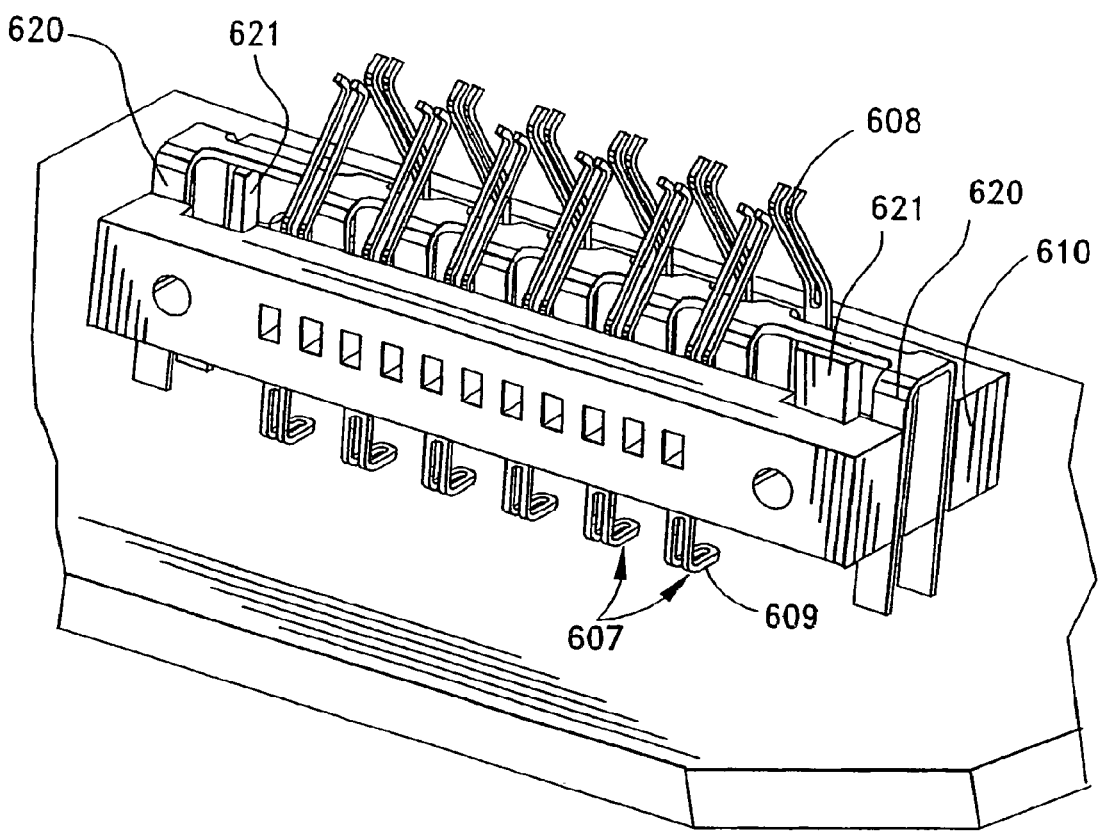
FIG. 27B is a perspective view of the interior contact assembly of the connector of FIG. 27A, with the sidewalls removed and illustrating the structure and placement of the coupling staple.
Figure 28:
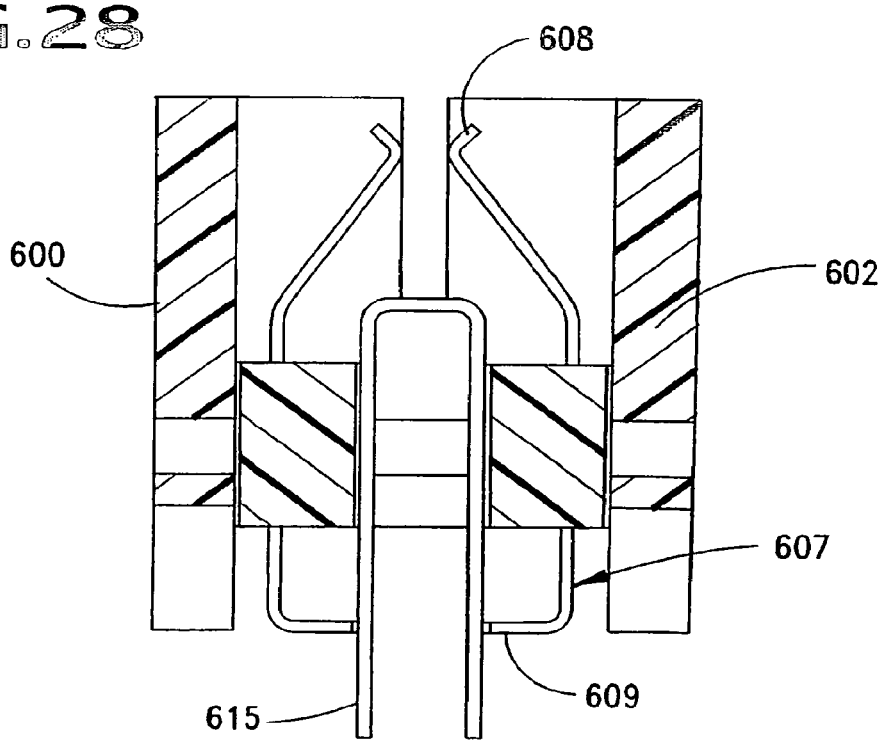
FIG. 28 is an end view of the connector of FIG. 26.

FIG. 27A illustrates a skeletal view of the endcap connector 600 and shows how the contacts, or terminals 607 are supported within and extend through the connector housing 602. The terminals 607 may include a dual wire contact end 608 for redundancy in contact (and for providing a parallel electrical path) and the connector 600 may include a coupling staple 615 that has an inverted U-shape and which enhances coupling of the terminals across the housing. The tail portion of these dual wire terminals 607 enhance the stability of the connector. In this regard, it also provides control for the terminals that constitute a channel (laterally) across the housing slot 601. FIG. 27B is a view of the interior contact assembly that is used in the endcap connector 600. The terminals 607 are arranged on opposite sides of the connector and are mounted within respective support blocks 610. These support blocks 610 are spaced apart from each other a preselected distance that assists in spacing the terminal contacts 608 apart. A coupling staple 615 having an overall U-shape, or blade shape, may be provided and may be interposed between the terminals 607 and support blocks 610 to enhance the coupling between and among the terminals 607. FIG. 28 is an end view of the connector 600.

Figure 29A:
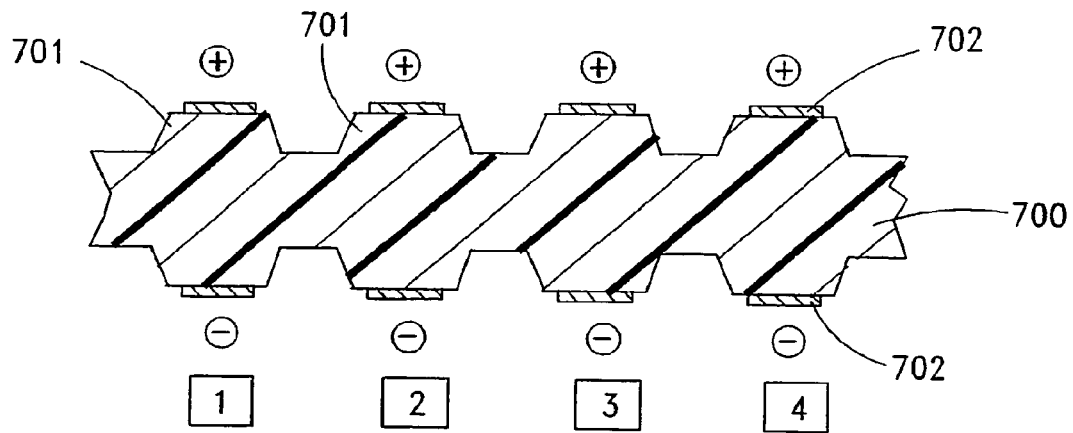
FIGS. 29A-C are end views of other embodiments of transmission channel links that utilize, in FIG. 29A, the dielectric body of the transmission channel for the medium through which coupling is effected, and in FIGS. 29B-C, the air spacing between the conductive elements as the medium through which coupling is effected.
Figure 29B:
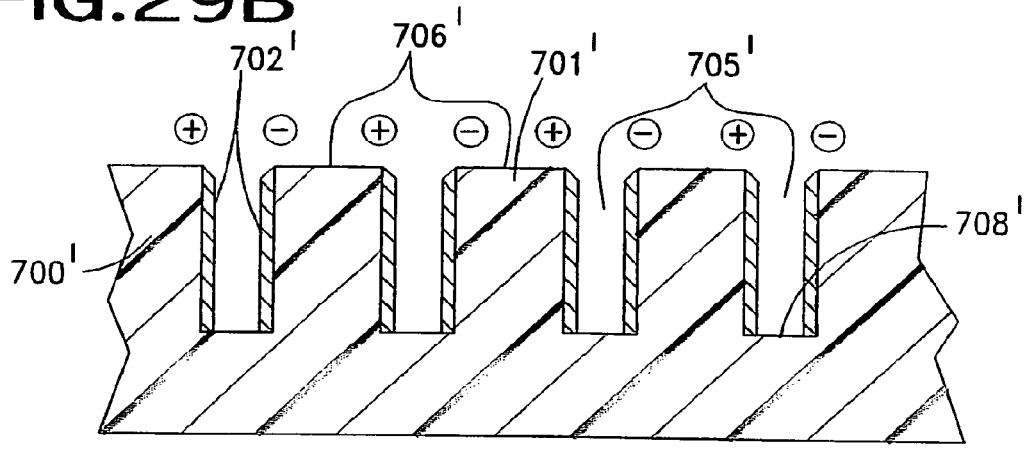
Figure 29C:
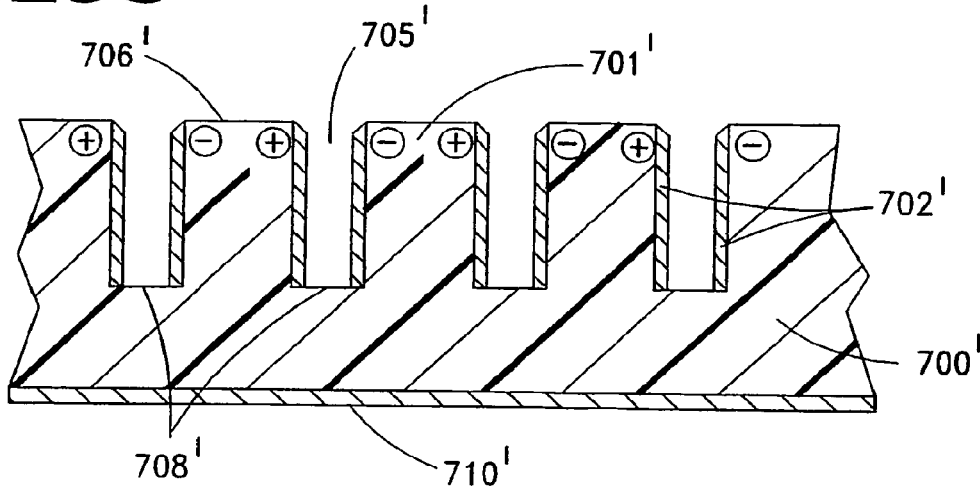
Figure 30:
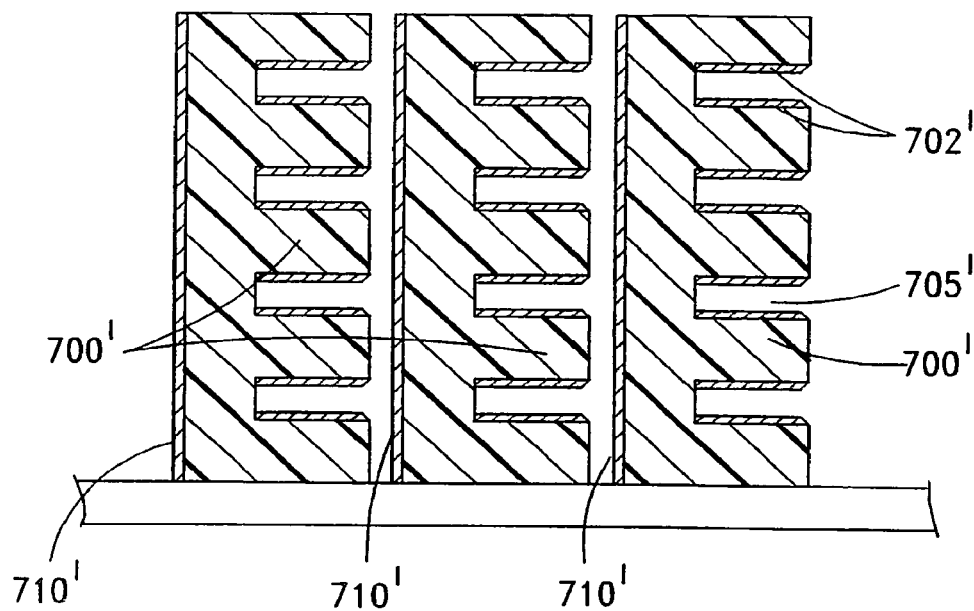
FIG. 30 is an end view of an array of transmission channel links of FIG. 29C arranged on a mount and illustrating the packing of transmission channels that may be obtained with the present invention.

FIGS. 29A-C illustrate another embodiment of a transmission channel link constructed in accordance with the principles of the present invention utilizing air as the dielectric and utilizing broadside coupling between conductive elements. In FIG. 29A, a dielectric substrate 700 is provided of generally uniform cross-section has body portions 701 formed at intervals thereon, with conductive elements 702 disposed on opposite surfaces of the substrate 700. In this regard, vertical signal channels are thereby defined in this arrangement, which are identified in the boxes appearing below each of the bodies 701 in FIG. 29A. The polarity of the conductive elements 702 may be arranged to provide for differential signal transmission, and as illustrated, one such arrangement locates the positive ("+") signal conductive surfaces on one side and the negative ("−") conductive surfaces on the other side of the dielectric substrate. As will be understood in the art, the opposite polarity conductive extents 702 will constitute pairs or signal channels, that are shown labeled from "1" to "4" underneath FIG. 29A. In this embodiment, the opposite conductive pairs are separated by the volume and extent of the intervening and supporting dielectric substrate. This construction is suitable for mezzanine configurations.

FIG. 29B illustrates a variation in the structure of such a connector with a dielectric body or substrate 700' having a plurality of slots 705' formed therein that are spaced apart from each other along the width of the substrate. Conductive surfaces 702' are disposed on the facing sides (or sidewalls) of the slots and are spaced apart from each by an intervening gap, which is filled with air. In this structure, the polarity of the conductive surfaces may be chosen as shown to have negative and positive signal conductive surfaces facing each other, thereby utilizing the air on the slot 705' as the dielectric between the associated pairs of conductive surfaces. Whereas in the embodiment of FIG. 29A, the signal pairs or channels were arranged vertically, or through the dielectric body, in the embodiment of FIGS. 29B and 29C, the arrangement and electrical affinity between the two conductive surfaces thereof is horizontally and extends across through an intervening air gap. In constructing transmission channels of this sort, the entire exterior surface of the substrate may be plated and the upper exterior surfaces 706' may be etched to remove their plating. Any plating that is initially present in the base 708' between the two sidewalls may be removed, such as by etching it away. As a result, a plurality of conductively disassociated vertical plates 702' are formed. In this type of arrangement, the primary field coupling occurs between oppositely charged pairs of conductive surfaces (horizontally in FIG. 29B), and the air gaps, or spacings, are tighter between the oppositely charged pairs of conductive surfaces than is the spacing between the gaps themselves. Thus, the differential pair spacing is "electrically" tighter by way of geometric control to ensure that the primary electrical affinity remains within the differential pair. The spacing and the contour of these conductive surfaces may be controlled by molding the connector and plating the desired surfaces in order to maintain an appropriate size of the connector.

FIG. 29C illustrates a similar structure, but one which utilizes a conductive ground plane 710' applied to the lower surface of the dielectric substrate 700'.

Such structures may be used to form dense matrices of transmission channel links as is illustrated in FIG. 30 wherein a plurality of substrates 700' are stacked together on their side. Each substrate may include a ground plane 710' and three communication or signal lanes, as illustrated or other arrangements may be chosen.

Figure 31:
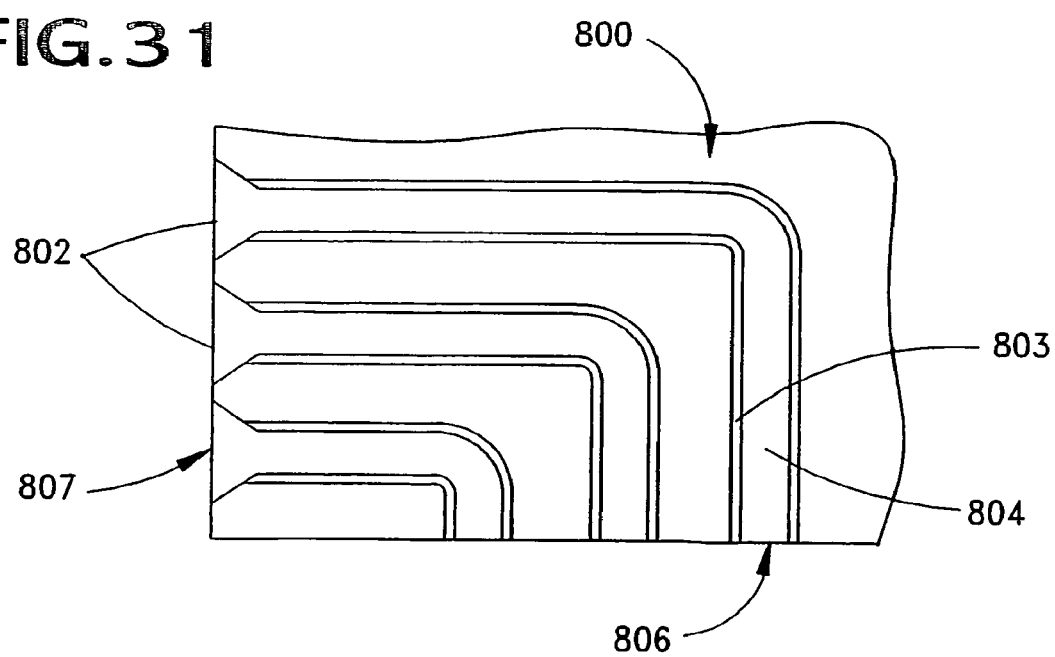
FIG. 31 is a plan view illustrating a right angle configuration of an air dielectric transmission channel similar to those of FIGS. 29A-C.

FIG. 31 illustrates the use of such a structure within a right angle context, with a dielectric block 800 with a plurality of grooves 804 formed therein. The opposite walls of the grooves 804 may be plated with conductive surfaces 803 that extend from one end 806 to a bellmouth 802 at the other end 807. The conductive surfaces 803 end short of the bellmouths 802 to electrically decouple the channel from the next transmission channel link section.

Figure 32:
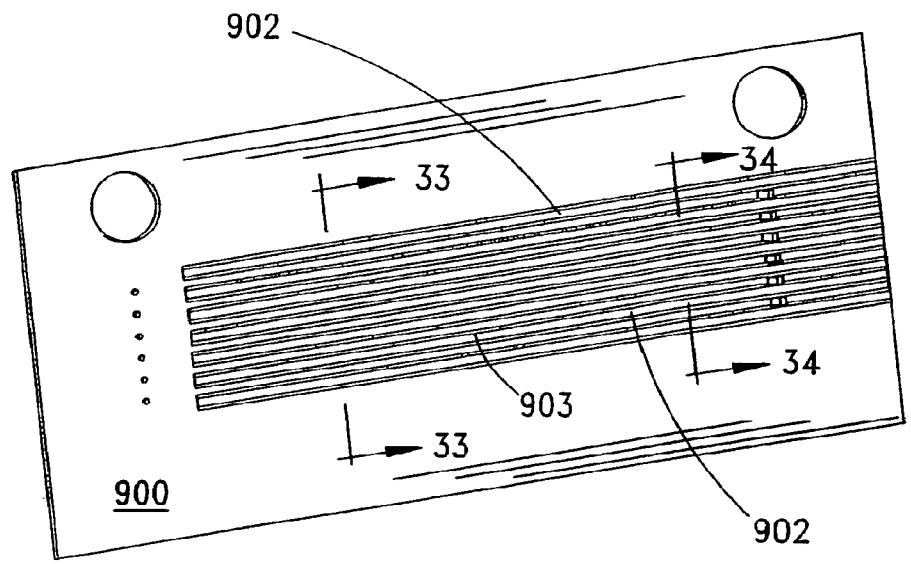
FIG. 32 is a perspective view of a waveguide assembly constructed in accordance with the principles of the present invention.
Figure 33:
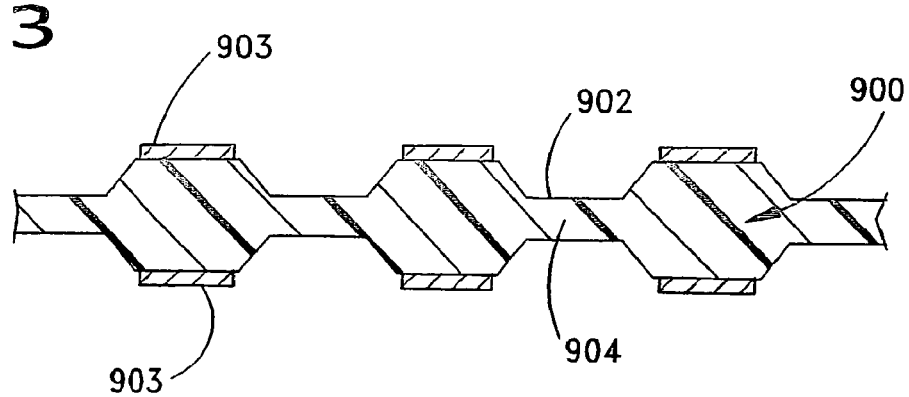
FIG. 33 is a sectional view of the waveguide assembly of FIG. 32, taken along lines 33-33 thereof.
Figure 34:
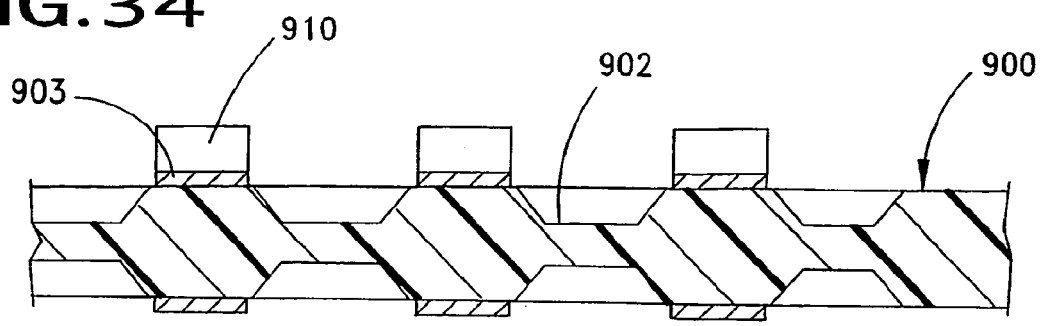
FIG. 34 is an enlarged detail view of a sectional view of the waveguide assembly of FIG. 32, taken along lines 34-34 thereof.

FIGS. 32-34 illustrate another construction of a waveguide media constructed in accordance with the principles of the present invention. As shown in FIG. 32, a dielectric substrate 900 is provided with a plurality of slots 902 formed thereon. The slots 902 are formed in opposing surfaces of the dielectric body 904 to define a series of raised lands that support plated or otherwise conductive surfaces 903. The slots 902 may be considered as forming a series of thin webs that reduce the cross-section of the dielectric and reduce capacitive coupling between alternate channels. The width of the conductive surface may be controlled within each signal channel or lane in order to control the impedance of the channels. As shown best in FIG. 34, surface mount members, such as feet 910 may be formed with the substrate and may include the conductive surfaces disposed on their exterior surfaces in order to establish a conductive interface for connecting with a circuit board, such as by soldering.

Figure 35:
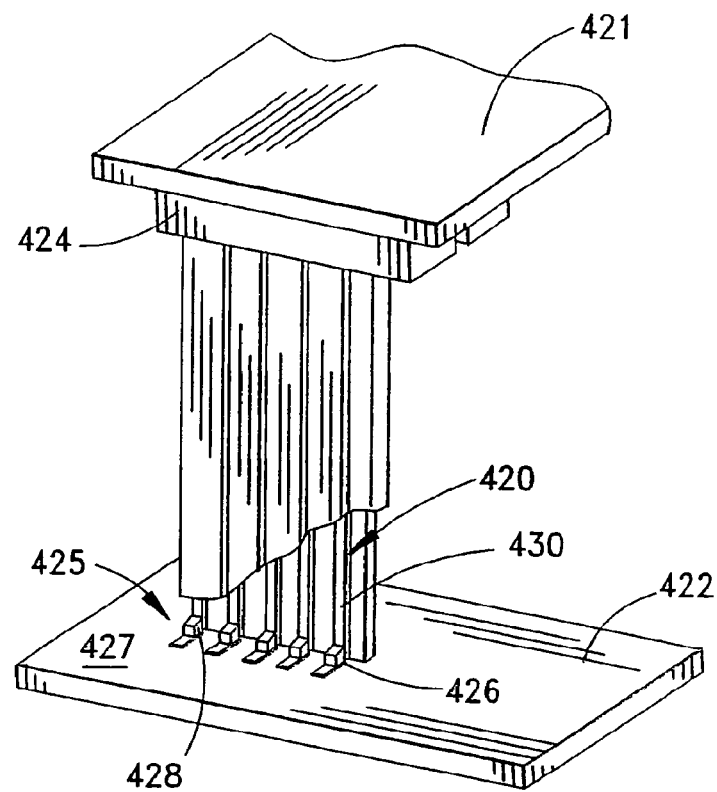
FIG. 35 is a perspective view of a connector assembly using a grouped channel transmission element of the invention extending between two circuit boards and protected by an exterior, protective jacket.

FIG. 35 illustrates a transmission line 420 of the invention that extends between two circuit boards 421, 422. The transmission line 420 mates with a connector 424, similar to the type shown in FIG. 26 and extends outwardly therefrom to a surface mount connection arrangement 425 disposed on the circuit board 422 (or formed as surface mounting "feet" that are molded or otherwise formed with the transmission line that may be attached to opposing contact pads or traces on the surface of the circuit board 422). Such a connection may include a plurality of contact members 426 that extend upwardly from the surface 427 and the contact members preferably includes conductive surfaces 428 that are arranged in opposition to the conductive strips 430 so that they will make direct contact with the strips 430 of the transmission element. They may be soldered, or otherwise attached or may rely solely upon frictional contact to make an electrical connection. The arrangement illustrated also includes an exterior protective jacket 431 formed of a plastic or metal (provided that the interior side thereof which opposes the transmission element is protected with an insulator) to protect the transmission channel from damage and exterior contact.

Figure 36:
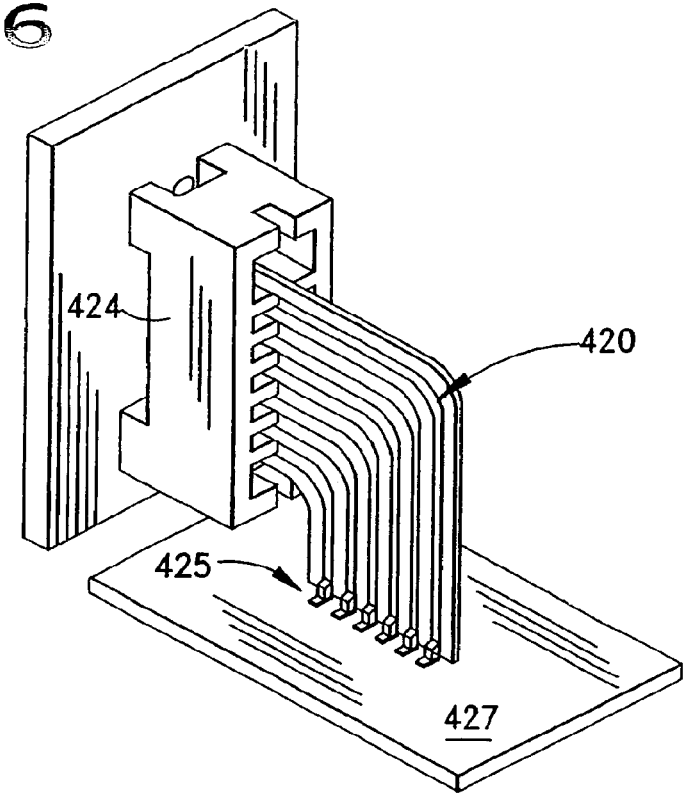
FIG. 36 is a perspective view of a variation in the use of the grouped element channel links of the invention, illustrating a right angle application thereof used to connect two circuit boards together.

In FIG. 36, the transmission link 420 is illustrated in a right angle configuration extending between two circuit boards. The transmission link may be molded into such a shape with the desired physical dimensions of thickness, spacing, etc. so as to maintain the waveguide parameter through the turning radius. In the application shown, the transmission link interconnects a surface mount connector 424 with a circuit board 427 by way of a surface mount arrangement 425 directly positioned on the surface of board 427.

Figure 37:
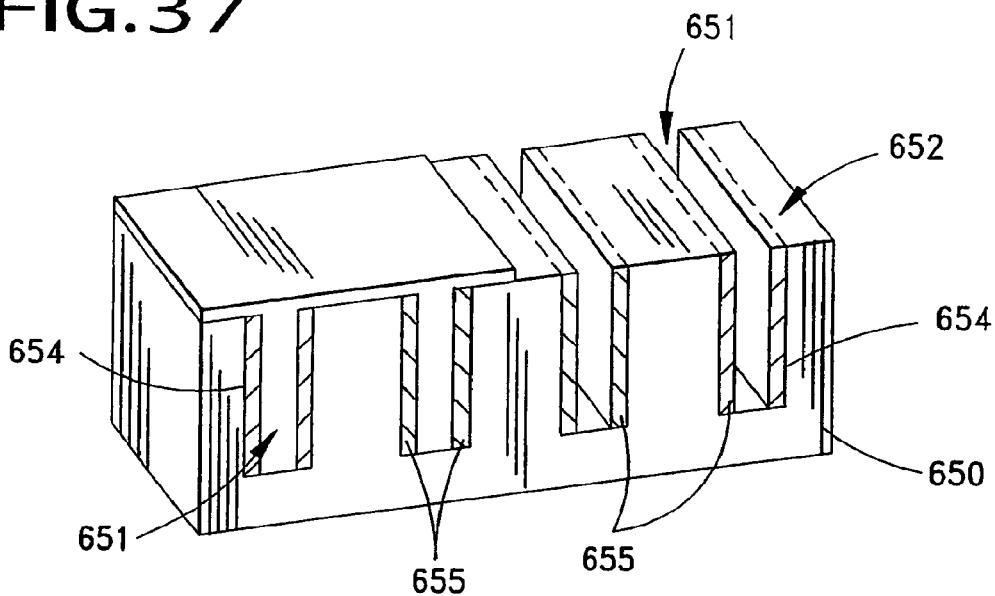
FIG. 37 is a perspective view of a high voltage, high density transmission line constructed in accordance with the principles of the present invention.
Figure 38:
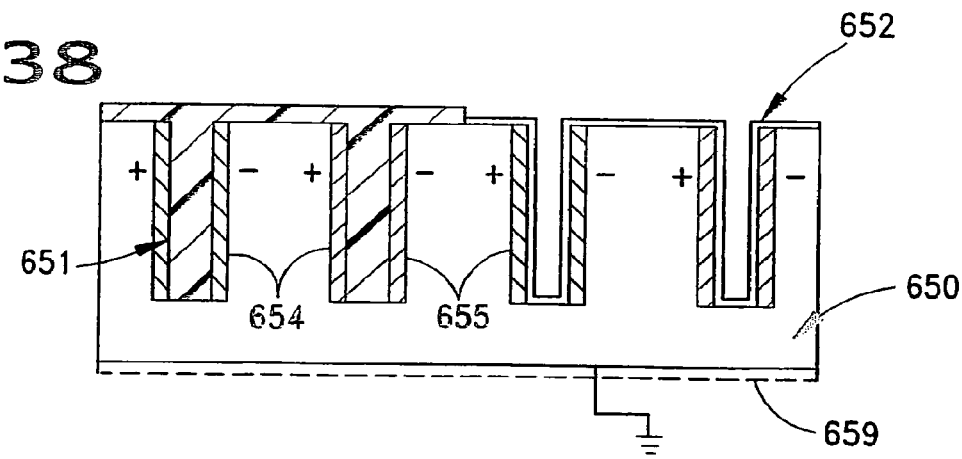
FIG. 38 is an end view of the transmission line of FIG. 37.

FIGS. 37 and 38 illustrate another embodiment of a grouped element channel transmission line, or link 650, that is particularly suitable for carrying high voltages and currents at high density contact spacings. The body of the transmission line 650 is formed from a dielectric and it has a series of grooves, or slots 651, formed therein that extend into the body portion thereof from one surface 652 thereof. The sidewalls 654 of these slots are conductively coated with a conductive material, such as by plating, and in effect define a series of "plates" 655 that are opposed to each other and are separated by the intervening space, or air, that will typically occupy the slots 651. In the left of FIGS. 37 and 38, an insert molded plug 658 is shown and this plug includes a cap portion 659 and one or more tongues, or fillers 660 that depend from the cap portion 659 and which extend into and completely occupy the space of the slots 651. A ground plane 659 may be deposited on the lower surface of the transmission line of FIGS. 37 & 38 to provide increased capacitive coupling.

In this manner, and as shown best schematically in FIG. 38, the opposed polarity (i.e., "+" or "−") conductive pairs of contacts are electrically isolated from each other, but nevertheless define a complete circuit. The sizes involved with the transmission elements of the present invention permit very high densities to be achieved with a low inductance delivery mode, especially due to the large number of common parallel current paths. To the right of FIGS. 37 and 38 is shown another means for accomplishing this isolation, namely the use of a conformal coating that conforms to the overall slot and land configuration but which provides electrical insulation or isolation between the two conductive surfaces. The use of opposed pairs in the transmission lines, over which is traversed current across and possibly on two opposing surfaces thereof, will lead to a lower loop inductance of the transmission line system.

Figure 39:
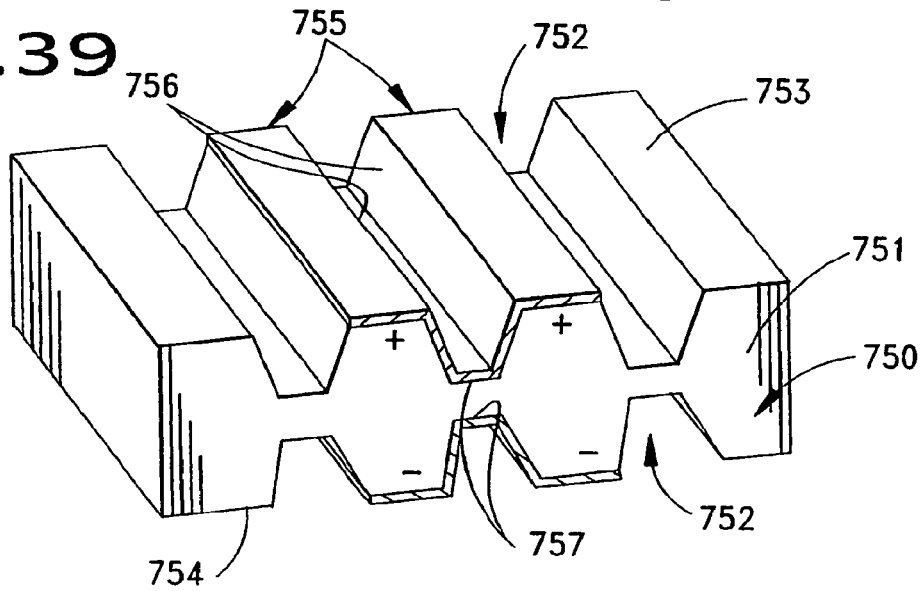
FIG. 39 is a perspective view of a transmission line of the invention that is suitable for use as a low impedance power transmission line.

As shown in FIG. 39, the transmission lines of the present invention may also be used to conduct power at very low impedance. In the transmission line 750 illustrated, a dielectric body portion 751 is provided with a series of grooves 752 formed in its outer surfaces 753. In a departure from some of the previous embodiments, more than just the exterior surfaces of the land portions of the dielectric body are plated with a conductive material. Two such lands 755 are continuously plated for the length of the transmission line 750 and they are interconnected by plating in the groove, or trough 752, that separates them, so that five distinct surfaces are plated. these include the two lands 755, the two sidewalls 756 of the grooves 752 and the base 757 of the groove, which all cooperate to form a single power terminal of the transmission line. In this arrangement there is an increased surface area which will provide an increased capacitance between the power terminal and an associated ground terminal. The low inductance and increased capacitance will serve to lower the impedance of the overall system, so that the transmission lines of the present invention may be used for low impedance power delivery.

Figure 41:
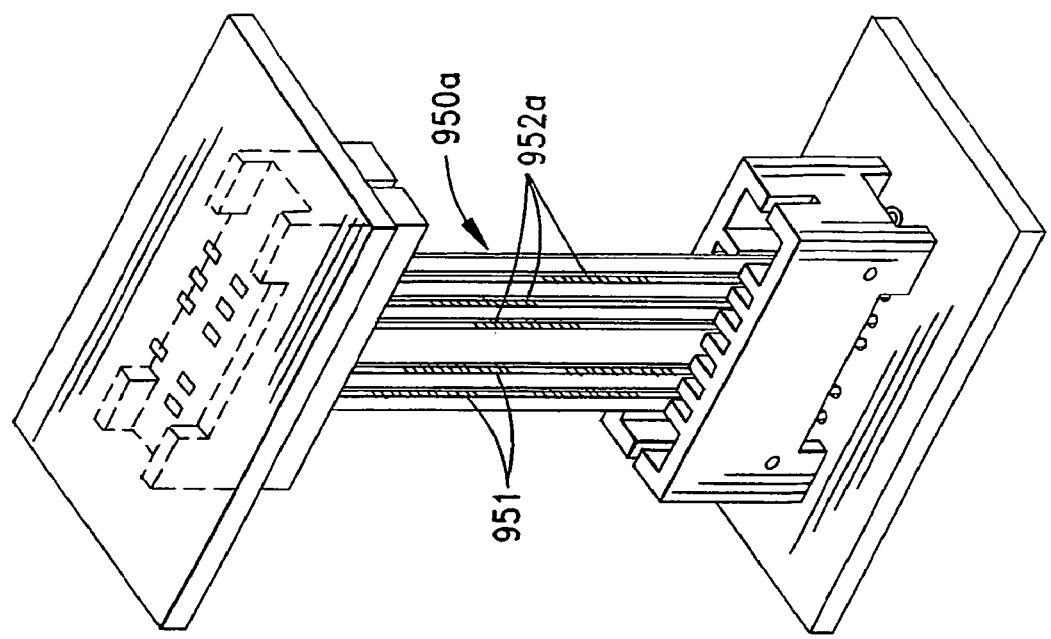
FIG. 41 is a perspective view of another mixed signal and power transmission line extending between two connectors and having multiple isolation regions disposed thereon to separate the signal and power conductors from each other electrically.
Figure 40:
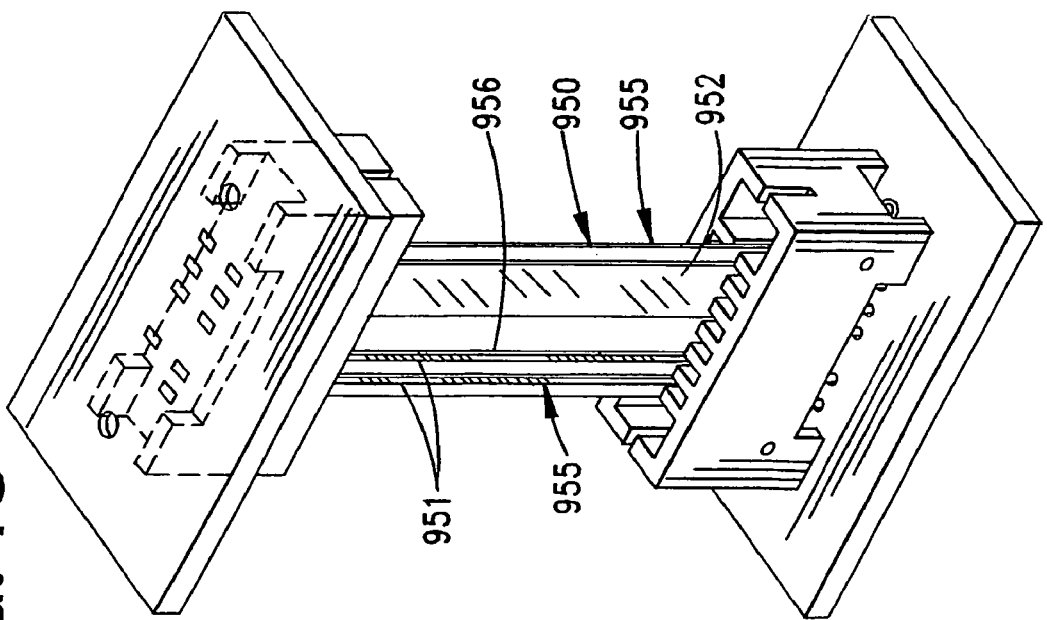
FIG. 40 is a perspective view of a mixed signal and power transmission line of the invention extending between two connectors and wherein the signal and power conductors are separated by a single isolation region.

FIGS. 40 & 41 illustrate possible executions of the use of a mixed signal and power transmission line. In FIG. 40, it can be seen that the transmission line 950 has two signal traces, or extents 951 and a single, wide power trace, or extent 952 formed on at least one, and preferably both (opposing) surfaces 955 of the transmission line. The power extents define a large power channel with an enlarged continuous conductor for increased current handling and high capacitance with the enlarged plate areas. The power and signal regions of this type of structure may be separated by a wide "isolation" region 956 that is molded or formed as part of the transmission line. In manufacturing processes such as extrusion, the tolerances and dimensions of the isolation region may be controlled with high reliability to obtain the maximum electrical benefit and minimize cross-contamination or shorting contact between the power and signal extents.

FIG. 41 illustrates a similar structure except that the power region includes a plurality of power extents 952a that are separated by intervening isolation regions.

Figure 42:
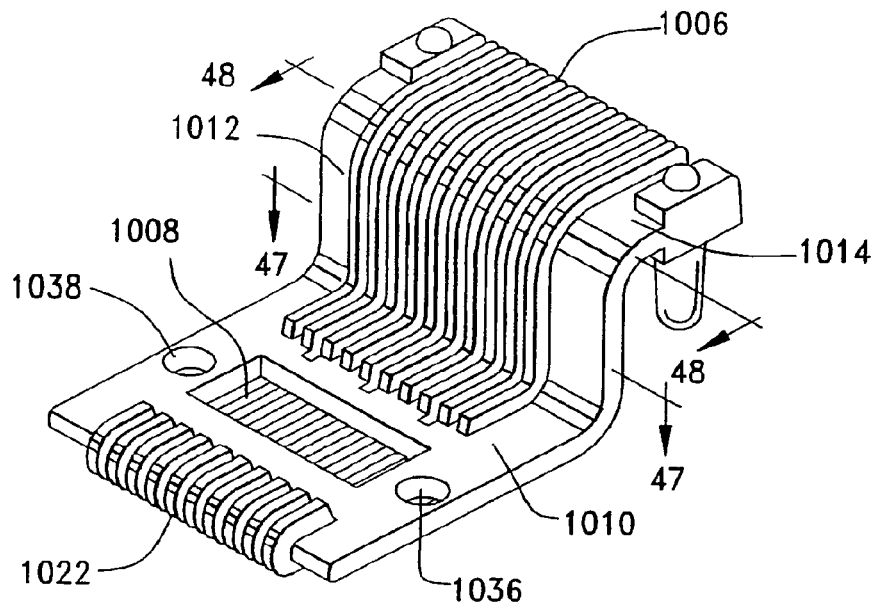
FIG. 42 is a perspective view of a frame for a grouped element channel link connector of the "pedestal" type, which may be used between an edge connector and a printed circuit board in accordance with the principles of the present invention.
Figure 43:
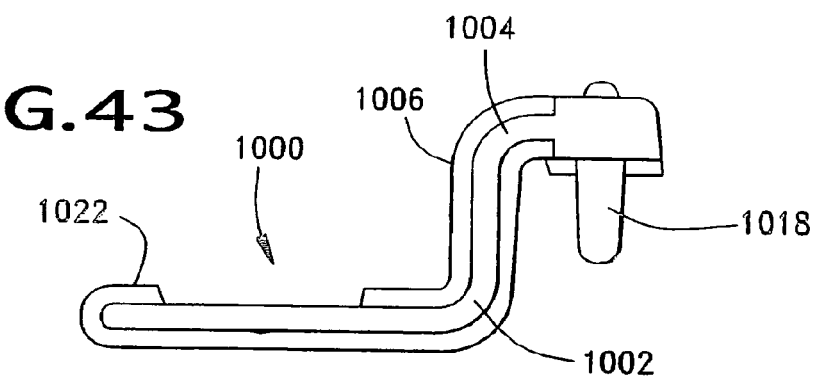
FIG. 43 is an elevational side view of the frame of the connector of FIG. 42.
Figure 44:
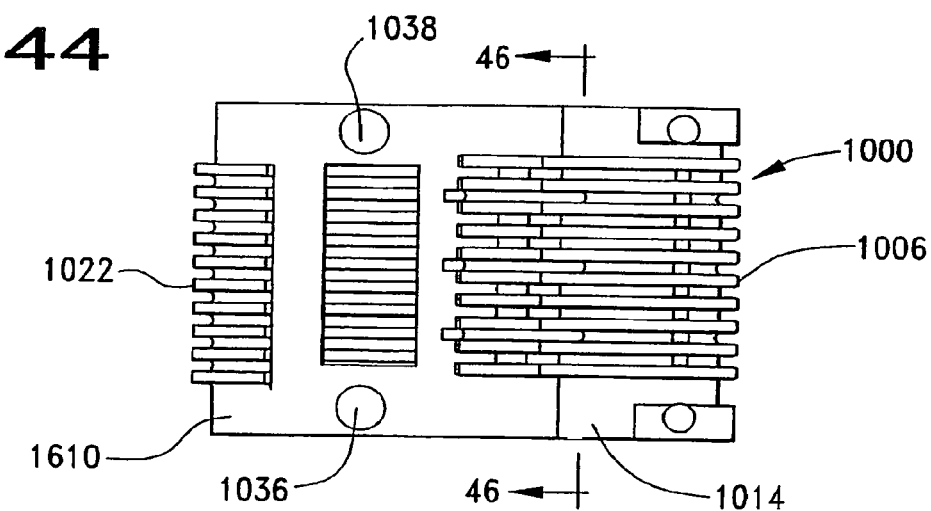
FIG. 44 is a top plan view of the frame of the connector of FIGS. 43 and 44.
Figure 45:
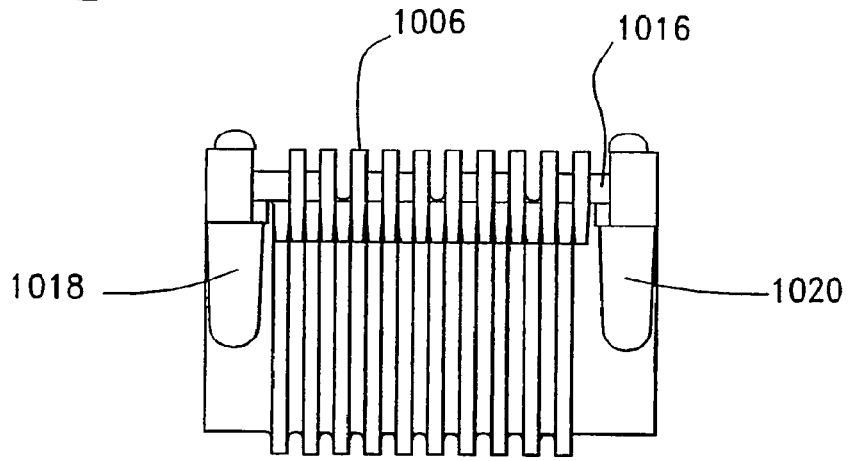
FIG. 45 is a rear elevational end view of the frame of the connector of FIGS. 42-44.

FIGS. 42-50 illustrate a pedestal-type arrangement which incorporates the principles of the present invention, and is preferably intended for use in applications where a transition is required between two levels. In FIG. 42, the pedestal-style connector as illustrated takes the form of a frame, generally designated 1000, for a grouped element channel link (GECL) connector. The frame 1000 has a plurality of raised rib-like elements running in generally parallel relationship along the contoured surfaces thereof. Frame 1000 may be described as being elongated in the longitudinal direction of the rib-like elements, as compared to the width of frame 1000. A first group of raised elements 1006 runs from one side of an aperture 1008 disposed in a base portion 1010 of the frame

Figure 50:
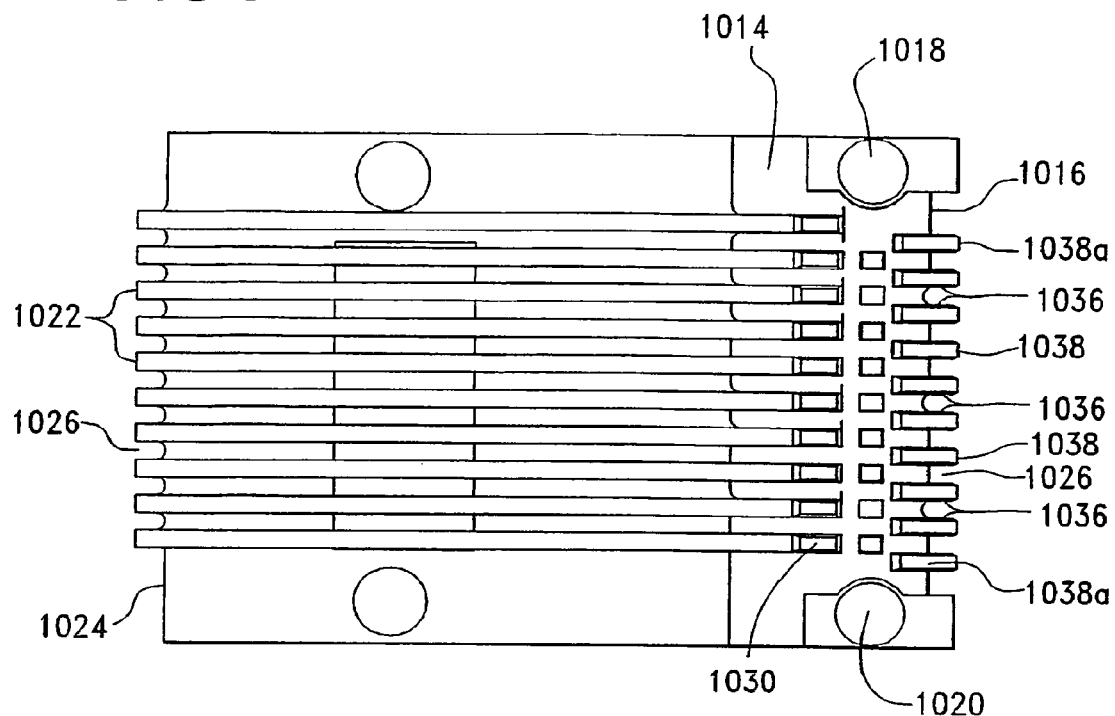
FIG. 50 is an enlarged bottom plan view of the connector of FIGS. 42-49.

1000, and runs up a front side of a generally vertical portion 1012, and then runs across the top side of a top portion 1014, and further wraps around a back end 1016 (FIG. 45) of frame 1000, and finally terminates on the underside of top portion 1014 in the vicinity of a pair of centering and support pins 1018 and 1020 (FIG. 50). The general configuration of this frame is similar to an S-shape and it provides a torturous path between two levels in which the transmission lines supported on the frame change direction at least once.

A second group of raised elements 1022 runs from an opposite side of aperture 1008, wraps around a front edge 1024 of the frame 1000, runs along the underside of base portion 1010, runs up the backside of vertical portion 1012, then runs along the underside of top portion 1014, and also terminates on the underside of top portion 1014 in the vicinity of the centering and support pins 1018 and 1020, but short of the terminal ends of first group of raised elements 1006. Thus, frame 1000 provides two groups of raised elements 1006 and 1022 that run in opposite directions from near aperture 1008 on the top side of base portion 1010 to the underside of top portion 1014 of frame 1000. As seen in FIG. 50, the raised elements 1006 and 1022, including the terminal ends thereof, may be in staggered relationship to each other, rather than in aligned relationship. Terminal ends 1028 of raised elements 1006 and terminal ends 1030 of raised elements 1022 may also be arranged in parallel rows, and may also project from the underside surface of top portion 1014 for suitable surface mount to, and for electrical contact with a corresponding conductive pattern on a printed circuit board or the like.

The frame 1000 is preferably formed with at least one bend so that the conductive traces will make at least one change of direction in their extent therealong. In the illustrated embodiment of frame 1000, and as seen in the side view of FIG. 43, frame 1000 may be provided with two approximately 90° bends 1002 and 1004 to accommodate positional translation of electronic signals between different vertical positions, as well as between different horizontal positions. Of course, the bends 1002 and 1004 may be provided at any desired angle. For example, bends 1002 and 1004 could be less than, or more than, 90° and achieve the desired results. These bends in effect define a torturous path for the conductors and permit the connectors of the present invention to be used in applications in order to interconnect together circuits at two different levels within an electronic device, such as a server or router or the like.

The frame 1000 may be formed from a catalyzed resin, such as a liquid crystal polymer (LCP), by known molding techniques. The frame 1000 may then be over-molded, such as with a non-catalyzed resin, to provide the GECL connector illustrated in FIG. 51. In the over-molding process, certain features of frame 1000 are left exposed, such as the top surfaces of raised elements 1006 and 1022. Such exposed features can then be plated with a metal, such as for example with by an electroless plating process to form electrical conductors along the top surfaces of the raised elements 1006 and 1022. Of course, the over-molding process may be reversed with a non-catalyzed resin being molded first, and a catalyzed resin then molded to form traces for the metal plating of the desired conductors. A third technique is to mold the connector and then select the areas for metallization with a laser or with lithographic techniques. The connector may be molded as a single piece and the plating applied thereto either selectively or grossly and then etched away.

A pair of apertures that are defined in the base portion 1010 may be utilized, if desired, in the over-molding process to position or index frame 1000 during the molding process. Disposed between each raised element 1006 and 1022 is a recess or channel, such as channels 1026 shown in FIG. 50. The aperture 1008, also defined in the base portion 1010, will enhance the flow of the resin about the frame 1000, including filling of recesses or channels 1026 with resin to electrically insulate the metallization formed on the plurality of separate raised elements 1006 and 1022 to provide separate electrical conductors thereon.

Figure 46:
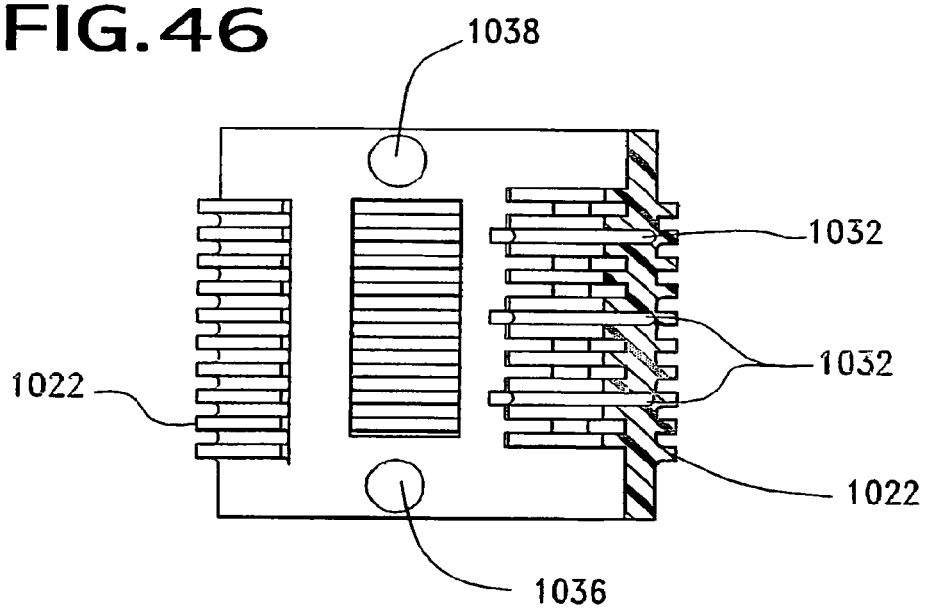
FIG. 46 is a cross-sectional view of the connector of FIG. 44, taken along line 46-46 thereof.
Figure 47:
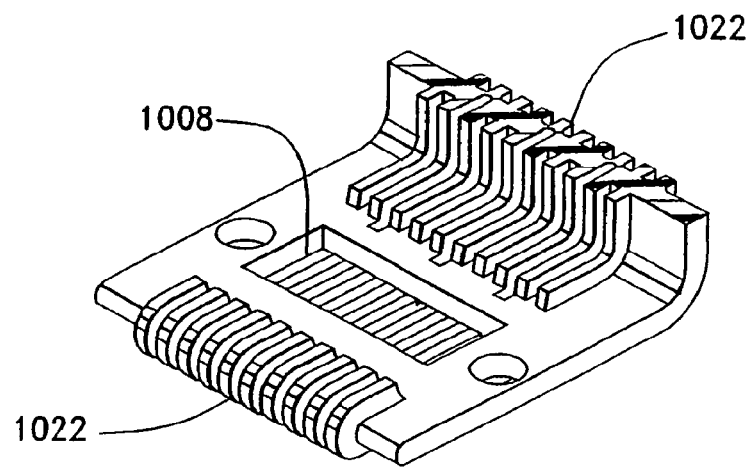
FIG. 47 is the same cross-sectional view as FIG. 46, but oriented as a perspective view.

In accordance with one aspect of the present invention, at least some of the channels disposed between raised elements 1006 and/or 1022 are of greater depth than channels 1026. For example, in FIG. 48, three channels 1032 are provided with greater depth. Channels 1032 are not filled with resin during the over-molding process. Thus, during the electroless metallization plating process, channels 1032 also have metallization formed on the sidewalls 1036 of channels 1032 to form metal conductors in the channels 1032. This can best be seen in FIG. 50 where metallization is formed on the sidewalls 1036 of three pairs of the raised ribs 1006 that form three channels 1032. The thickness of the metallization in FIG. 50 is enlarged for illustration purposes. These metallized channels 1032 are also shown in FIG. 46. Any metallization formed in the bottoms of channels 1032 can be removed by known techniques to provide two separate and opposed electrical conductors on the sidewalls 1036 in each channel 1032. Since channels 1032 are not over-molded, there is air dielectric between the metal sidewalls 1036. The channels 1032 with the plated sidewalls act as a transmission line for high frequency signals therein. For example, high speed differential electronic signals, such as about +5 volts and −5 volts, at frequencies of 10 Gigabits or higher, may be conducted along the opposed metallized sidewalls 1036. In this respect, the channels 1032 also act as waveguides which extend for the length of the transmission line that is defined by the two conductive trace portions. The intervening air gap has a dielectric constant of approximately or equal to 1.0 which enhances coupling between the two conductors.

With continuing reference to FIG. 50, other raised ribs 1038 of the set of raised elements 1006 have adjacent channels filled during the over-molding process such that only the top surface of ribs 1038 become plated with metal to form conductors during the plating process. Preferably, at least one of the ribs 1038 is disposed between the high frequency transmission lines formed in each of channels 1032. In use, the conductors formed on ribs 1038 are preferably used for low impedance sources, such as ground and power, to provide affinity for the differential signals in the transmission lines in channels 1032. To this end, it is further preferable to dispose a low impedance conductor on ribs 1038$a$ at both sides of the channels 1032. Thus, a preferred assignment of the conductors formed on the raised ribs 1038 and 1038$a$ and in channel elements 1032 across frame 1000 and across the corresponding connector 1050 is, for example, ground, differential signal pair, power, differential signal pair, ground, differential signal pair and power. Of course, assignment of the ground or power conductors 1038 or 1038$a$ may be changed since any power sources are considered to be low impedance, and similar in impedance to ground.

Figure 48:
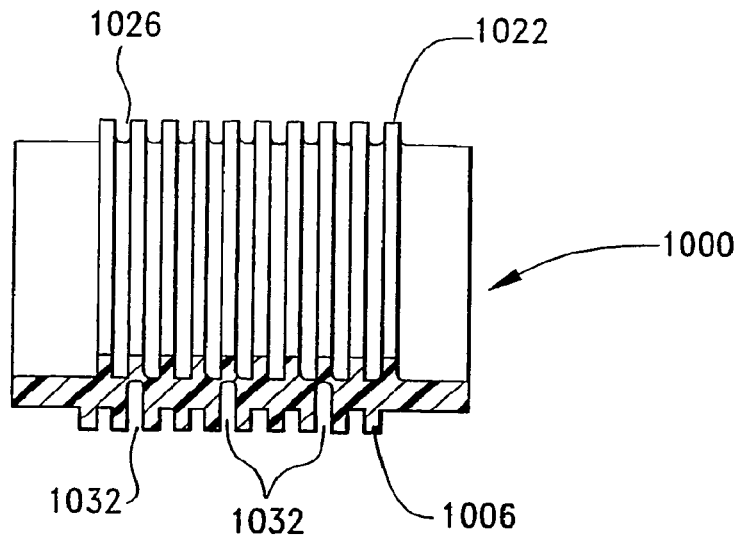
FIG. 48 is another cross-sectional view of the connector of FIG. 42, and taken along line 48-48.
Figure 49:
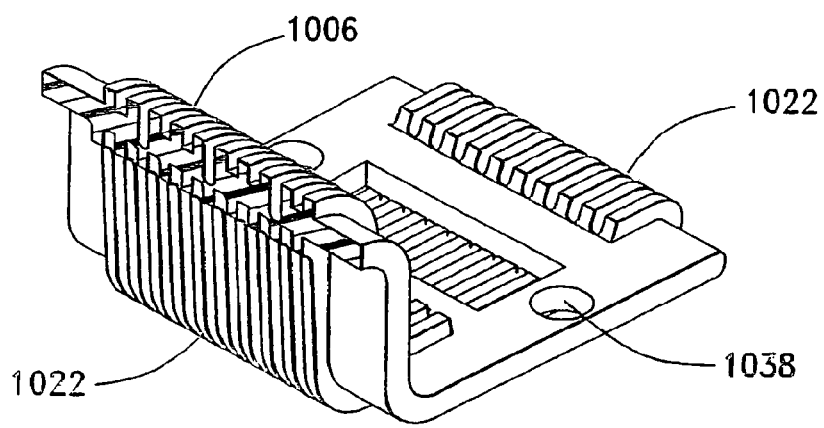
FIG. 49 is rear perspective view, taken partially in section, of the connector of FIGS. 42-48.

It may be noted that the raised elements 1022 are not provided with any channels 1032 in the embodiment shown in FIGS. 48 and 50. However, some of the elements 1022 may also be provided with transmission lines in channels 1032, if desired. In this embodiment it is assumed that conductors formed on top of elements 1022 may be utilized to conduct lower frequency signals, or for additional power and ground lines.

Figure 51:
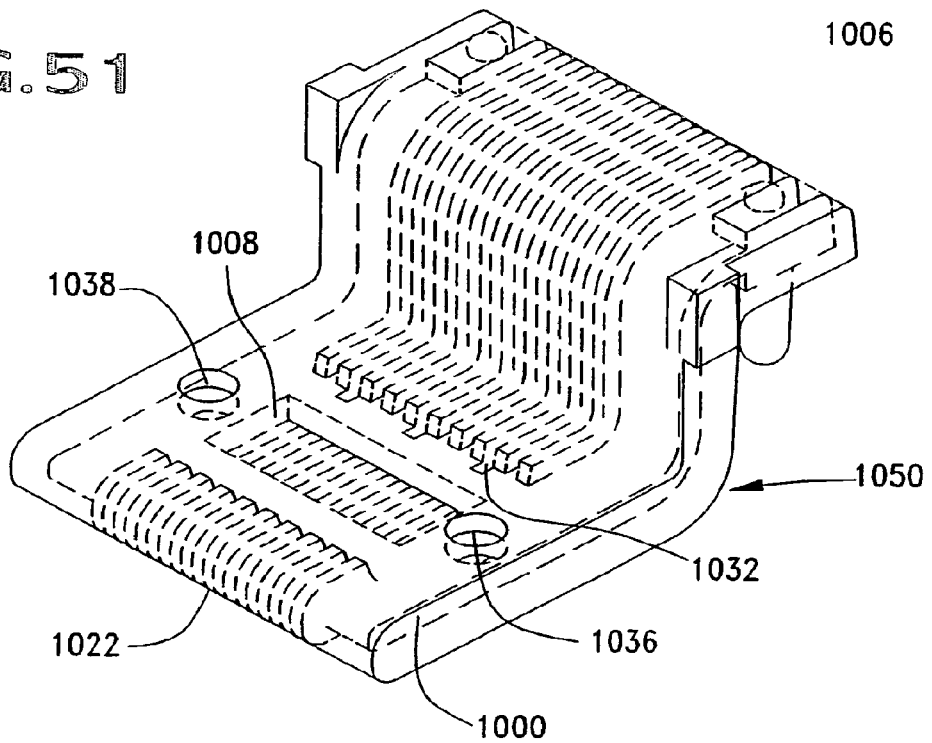
FIG. 51 is perspective view of the frame of FIGS. 42-49 after the frame has been over-molded with another plastic material in accordance with the present invention, with certain elements of the frame illustrated in phantom.

FIG. 51 illustrates a grouped element channel link connector, generally designated 1050, after the frame 1000 is over-molded. Various features of frame 1000 are shown in phantom lines. Connector 1050 therefore retains the attributes of frame 1000 such as its elongate shape in the direction of the raised elements or ribs and one or more bends to translate signals between vertical as well as horizontal positions.

Figure 52:
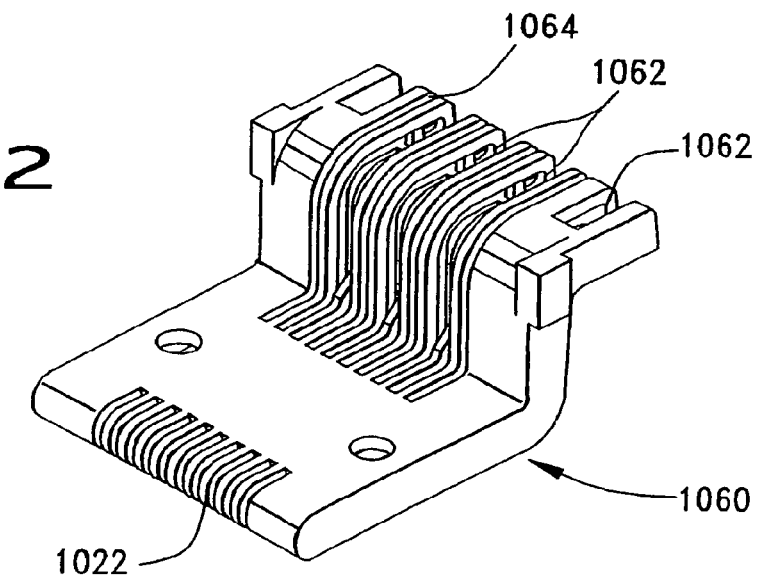
FIG. 52 is a perspective view of an alternative embodiment of the grouped element channel link connector illustrated in FIGS. 42-51, but illustrating another embodiment in which a larger spacing is provided between the grouped channel elements.
Figure 53:
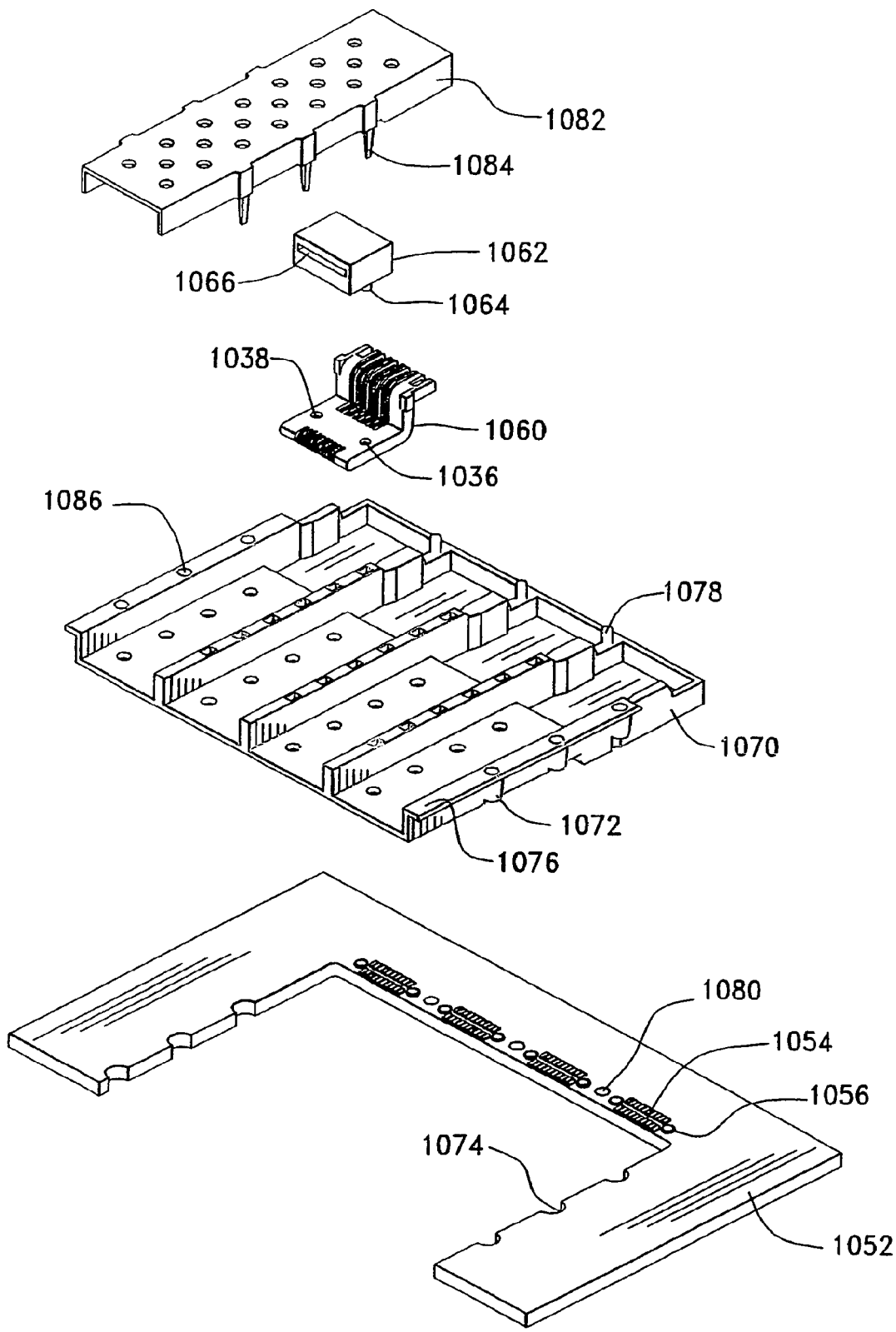
FIG. 53 is an exploded view of the connector of FIGS. 42-52 used in an application in which an edge connector is connected to a printed circuit board, and wherein the edge connector and printed circuit board are at different elevations.

An alternate embodiment of connector 1050 is generally designated 1060 in FIG. 52. Connector 1060 is generally similar to connector 1050 except that channels 1062 that are partially interposed between signal channel transmission conductive surfaces are wider than the channels 1032 in the connector 1050. The connector 1060 may typically be a connector that mates with a circuit card or board edge of a transceiver or adapter module that is inserted into and held within a conductive shielding cage 1070, 1082. The forward edge at 1022 would support a connector 1062 as shown in FIG. 53, while the rear edge to which the channels 1062 extend would contact the upper surface of a circuit board 1052. (FIG. 53.) In this embodiment of connector 1060, no low impedance conductors, such as on ribs 1038 in FIG. 50, are provided between the transmission lines formed in channels 1062. However, a low impedance conductor may be provided to either side of channels 1062, such as on ribs 1064. Again, channels 1062 are not filled during the over-molding process, such that the sidewalls of channels 1062 are plated with conductive metal during the plating process in a manner already described for channels 1032 of connector 1050.

Figure 54:
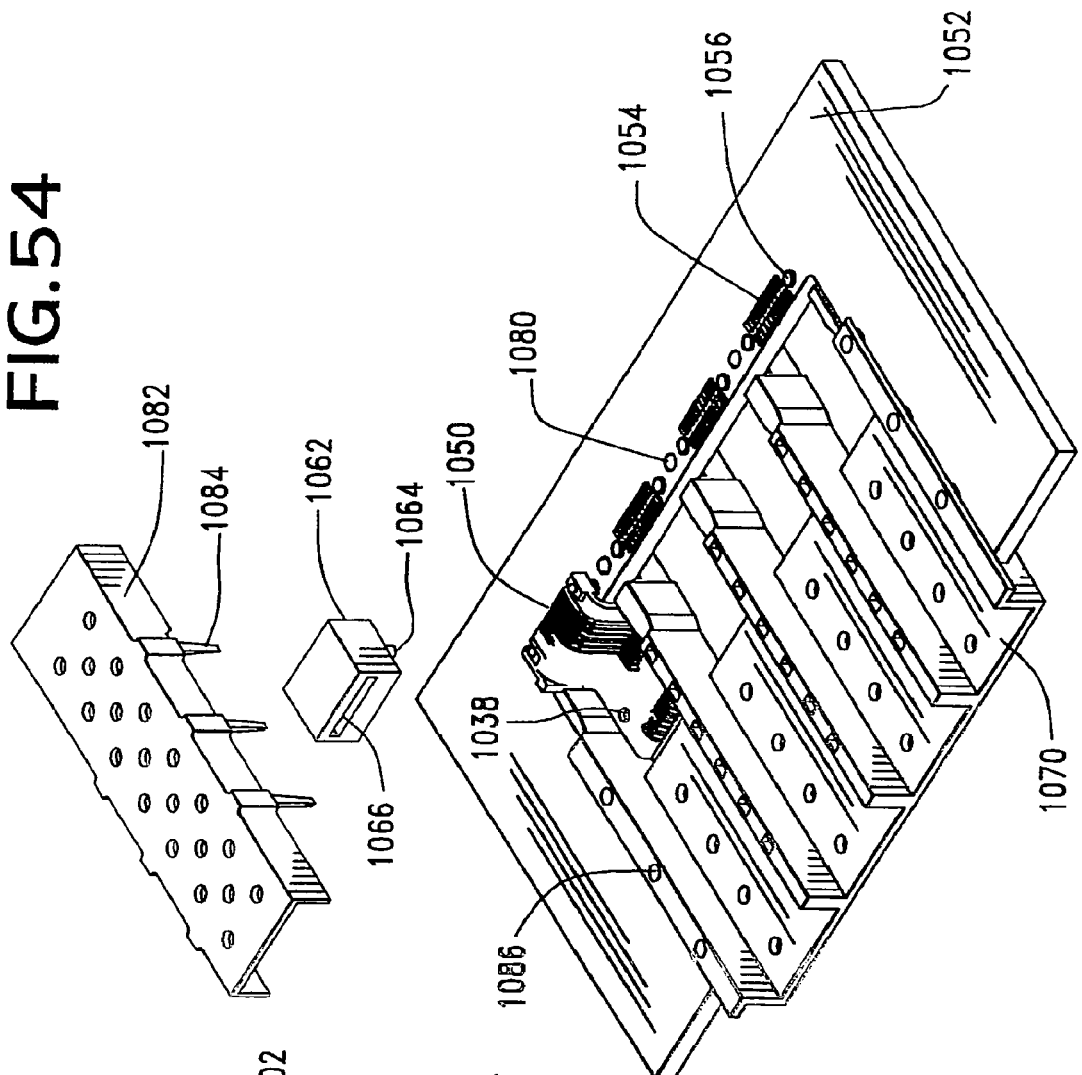
FIG. 54 is the same view as FIG. 53, but with the connector and its shielding tray being attached to the printed circuit board, but with the cover and edge connector tray exploded for clarity.

An example of the use of the GECL connector 1050, or the alternate embodiment GECL connector 1060, is illustrated in FIGS. 53 and 54. A printed circuit board ("PCB") 1052 may be provided with a plurality of connector surface mounting areas 1054, each including a plurality of electrical contacts for mating to corresponding contacts on the underside of connectors 1050 or 1060. Apertures 1056 may be provided at the mounting areas 1054 to engage the centering and mounting pins 1018 and 1020 and align the connector 1050 to PCB 1052.

The card edge connector 1062 has downwardly depending pins 1064 that mate with apertures 1036 and 1038 in GECL connectors 1050 and 1060. Edge connector 1062 has a plurality of contacts on its underside that make electrical connection with the metal conductors on the raised elements 1006 and 1022 of connectors 1050 and 1060 when attached thereto. A generally rectangular opening 1066 is defined in the face of edge connector 1062 to receive an edge of a mating connector with a plurality of electrical contacts. Thus, all, or any select portion, of the signals present on the conductors formed on raised elements 1006 and 1022, including the channel elements 1032 and 1062, may be made available at opening 1066 of edge connector 1062.

A connector tray, or shielding cage 1070 may optionally engage PCB 1052 and it may be divided into a plurality of chambers; one for each connector 1050 or 1060. A plurality of round bosses 1072 defined on sides of connector tray 1070 fit into correspondingly shaped recesses 1074 defined in the edges of PCB 1052, and vertically oriented pins 1078 on tray 1070 fit into apertures 1080 disposed between the mounting areas 1054 to lock tray 1070 to PCB 1052. A lip 1076 of tray 1070 rests on the upper surface of PCB 1052. A plurality of tray, or cage covers 1082, are preferably provided with downwardly depending pins 1084 which may be inserted in apertures 1086 defined in the connector tray 1070. Connector tray 1070 and tray covers 1082 may be plated with a metal to reduce EMI, RF or other electrical interference about the connectors 1050 and 1060.

Figure 55:
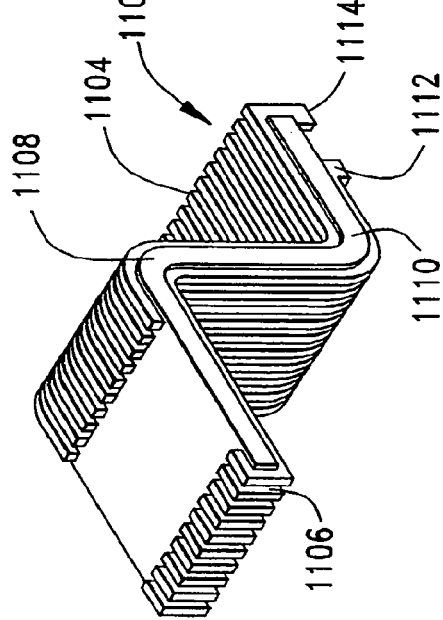
FIG. 55 is a perspective view of another connector frame structure constructed in accordance with the principles of the present invention and which is intended for use in an alternate embodiment of the invention.

Another frame member embodiment is shown in FIG. 55 at 1102. This frame 1102 has a plurality of elements 1104 and 1106 (and which are plated with a conductive material) that are supported on a base portion and which extend upwardly therefrom so that they are "raised" with respect to the base. The frame 1102 also has one or more bends, such as at 1108 and 1110 in which the conductive traces of the connector make two changes of direction, for the same reasons and purposes as in the earlier-described frame 1000. Rows of contacts 1112 and 1114 are disposed at the ends of these elements 1106 and 1104, respectively, are adapted to make contact with corresponding rows of contacts, such as at the mounting area 1054 on the circuit board 1052 in FIGS. 53 and 54. The free ends 1106 of these conductive elements permit another connector to be soldered to the connector 1100. As seen in FIGS. 55 & 56, the two free ends are spaced apart from each other in the vertical direction and they further preferably lie in two different, but generally parallel planes.

Frame 1002 is adapted to be over-molded into another style of pedestal connector 1100 that is shown in FIGS. 56-58. At least some channels between the raised elements 1104, as shown in FIG. 56, such as the three channels 1122, are preferably left open during the over-molding process so that sidewalls of channels 1122 may be metallized to operate as channel elements or transmission lines, as previously described above for connectors 1050 and 1060. This plating with a conductive material may also be done prior to the overmolding of the outer portions of the connector.

The frame member 1102 is formed with an outer portion, preferably over molded about selected portions thereof and this outer portion has a pair of support walls 1199 that extend vertically as shown in FIG. 56 to create a cavity, or receptacle 1200 underneath the one end 1106 and adjacent to the other end so that the pedestal connector mat be placed on a circuit board over another connector. This connector has a greater width of the slots between its sidewalls and these wider channel elements 1124 are otherwise similar in construction, arrangement and operation to the already described wider channel elements 1062 utilized in connector 1060 in FIG. 52. Metal plating 1132 is disposed on the opposing sidewalls of channel elements 12. Any metal formed in the bottom of channels 124 during the metallization process may be removed by various techniques known to the prior art. In the embodiments of the pedestal connector 1100 illustrated in FIGS. 55-58, raised elements 1106 are not provided with any narrow or wide channel elements 1122 or 1124, but may be if so desired. A pair of apertures 1128 and 1130 in the top surface of pedestal connector 1100 is adapted to receive the edge connector 1062 shown in FIGS. 53 and 54, in similar fashion and for the same purposes as described above for connectors 1050 and 1060.

The invention claimed is:

1. A connector, comprising:
an insulative body portion having two spaced-apart ends; and
a plurality of pairs of conductive traces disposed thereon, each of the pairs of traces cooperatively defining a differential signal transmission channel extending along the body portion and configured to operate at 10 Gigabits per second and extending between the ends of the body portion, the body portion having at least one bend disposed therein so that the channel changes direction at least once as it travels between the ends of the body portion.

2. The connector of claim 1, wherein the conductive traces extends extend between the body portion ends in both horizontal and non-horizontal directions.

3. The connector of claim 1, wherein the body portion two ends include a mounting end for mounting the connector to a circuit board and a mating end for engaging another connector.

4. The connector of claim 3, wherein the mounting end includes at least two support posts projecting therefrom which are adapted to be received in holes formed in the circuit board.

5. A connector, comprising:

an insulative body portion having two spaced-apart ends; and a plurality of pairs of conductive traces disposed thereon, each of the pairs of traces cooperatively defining a differential signal transmission channel along the body portion and extending between the body portion ends, the body portion having at least two bends disposed therein between the ends and the ends are disposed at two different vertical levels with respect to each other so that the conductive traces change direction in their extent between the ends of the body portion.

6. The connector of claim 5, wherein each of the bends is approximately 90 degrees.

7. The connector of claim 5, wherein each of the bends is less than 90 degrees.

8. The connector of claim 5, wherein the differential channel is configured to operate at ten (10) Gigabits per second.

9. A connector, comprising: an insulative body portion having two spaced-apart ends; a plurality of pairs of conductive traces disposed thereon, each of the pairs of traces cooperatively defining a differential signal transmission channel along said body portion and extending between said body portion ends, said body portion having an least one bend disposed therein so that said conductive traces change direction at least once in their extent between said body portion ends, wherein the connector body portion two ends include a mounting end and another end for engaging another connector, the mounting end being disposed at an elevation above that of the another end.

10. The connector of claim 9, wherein the differential channel is configured to operate at ten (10) Gigabits per second.

* * * * *